United States Patent [19]

Leue et al.

[11] Patent Number: 4,689,564
[45] Date of Patent: Aug. 25, 1987

[54] DIGITAL INTERFACE SUBSYSTEM FOR A MAGNETIC RESONANCE IMAGING AND SPECTROSCOPY SYSTEM

[75] Inventors: William M. Leue, Albany; Raymond J. Hodsoll, Jr., Galway, both of N.Y.

[73] Assignee: General Electric Company, Schenectady, N.Y.

[21] Appl. No.: 743,119

[22] Filed: Jun. 10, 1985

[51] Int. Cl.⁴ .................................. G01R 33/20
[52] U.S. Cl. .................... 324/309; 324/312; 324/313; 324/314
[58] Field of Search ............... 324/309, 312, 313, 314

[56] References Cited

U.S. PATENT DOCUMENTS

| | | | |
|---|---|---|---|
| 4,115,730 | 9/1978 | Mansfield | 324/312 X |
| 4,361,807 | 11/1982 | Burl et al. | 324/309 |
| 4,443,760 | 4/1984 | Edelstein et al. | 324/314 X |
| 4,480,228 | 10/1984 | Bottomley | 324/309 |
| 4,573,015 | 2/1986 | Abe et al. | 324/313 X |
| 4,585,992 | 4/1986 | Maudsley et al. | 324/309 |
| 4,585,993 | 4/1986 | Bottomley | 324/309 X |

Primary Examiner—Tom Noland
Attorney, Agent, or Firm—Geoffrey H. Krauss; James C. Davis, Jr.; Marvin Snyder

[57] ABSTRACT

A digital interface subsystem, for a magnetic resonance imaging and spectroscopy system, has an internal data bus interconnecting: a master sequencer, receiving instructions from a main system computer; a plurality of controlled generators for providing gradient-field, RF modulation and other required signal waveforms for proper excitation of a sample; and circuitry for analyzing the magnetic resonance response signals from the sample, responsive to the excitation signals for providing image information.

18 Claims, 14 Drawing Figures

ASSEMBLE FIG.S
2a THRU 2d
AS SHOWN

| MASTER SEQUENCER PERIOD GENERATOR FIELD bits b0-b15 | ENABLE, INT, SYNCH, ETC. FIELD bits b16-b23 | NEXT ADDRESS FIELD bits b24-b31 | Z1 GENERATOR MEANS & GATES 1-3 CONTROL FIELD bits b32-b47 | Z2 GENERATOR MEANS & GATES 4-6 CONTROL FIELD bits b48-b63 |
|---|---|---|---|---|

MICRO CODE DATA WORD FORMAT

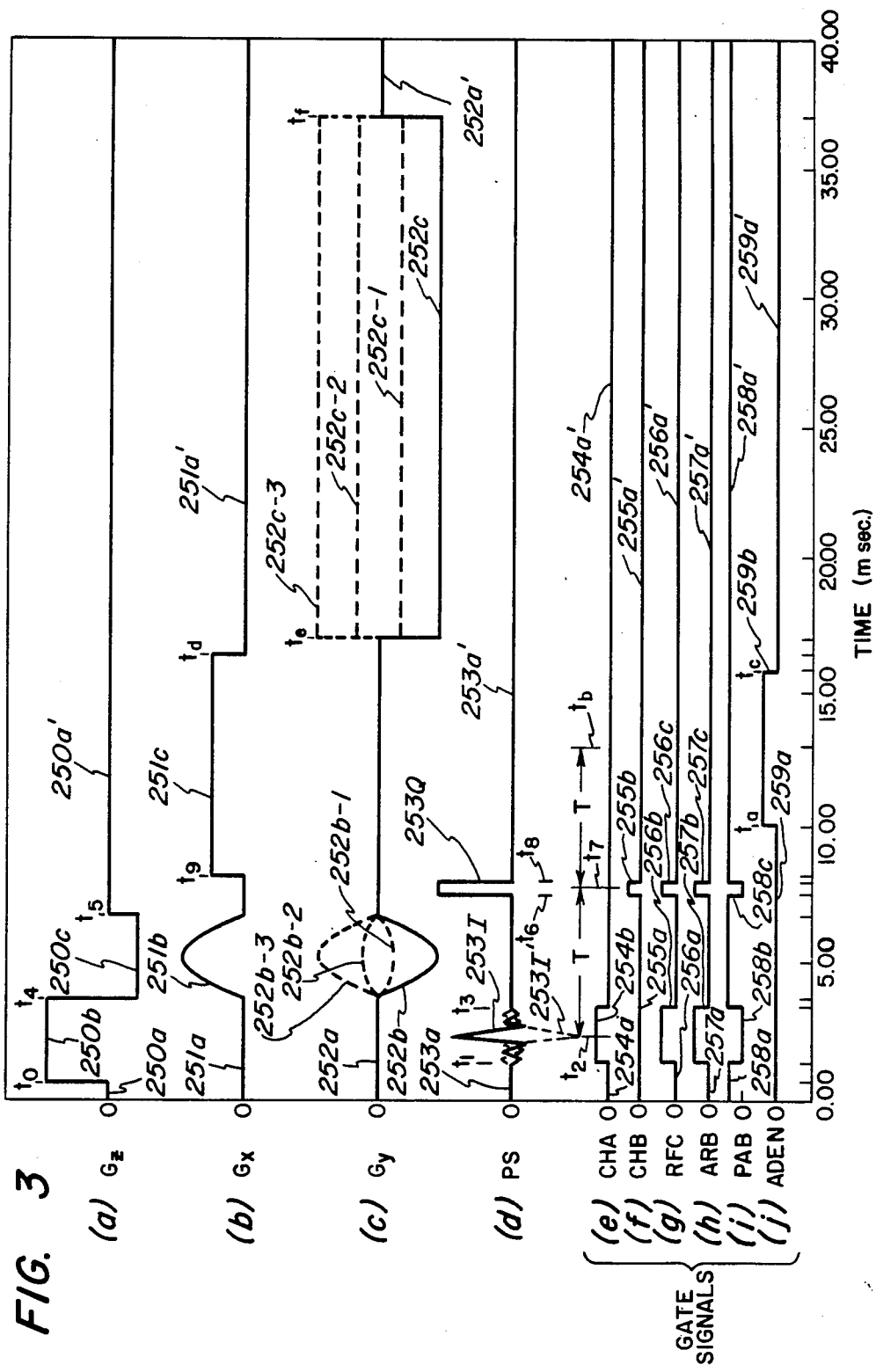

DIGITAL INTERFACE SUBSYSTEM FOR A MAGNETIC RESONANCE IMAGING AND SPECTROSCOPY SYSTEM

RELATED APPLICATIONS

This application is related to applications Ser. Nos. 743,125, 743,115 and 743,121, filed on even date herewith, all assigned to the assignee of the present application and incorporated herein in their entireties by reference.

BACKGROUND OF THE INVENTION

The present invention is directed to nuclear magnetic resonance imaging and spectroscopy systems and, more particularly, to a novel digital interface subsystem for an imaging and spectroscopic nuclear magnetic resonance (NMR) system. The nuclear magnetic resonance phenomenon occurs in atomic nuclei having an odd number of protons and/or neutrons. Each such nucleus has a net magnetic moment such that when placed in a static homogeneous magnetic field, denoted $B_0$, a greater number of the involved nuclei become aligned with the $B_0$ field to create a net magnetization, denoted M, in the direction of the $B_0$ field. The net magnetization M is the summation of the individual nuclear magnetic moments. Because a nuclear magnetic moment is the result of a nuclear spin, the terms "nuclear moment" and "nuclear spin" are generally used synonymously in the art.

Under the influence of the static homogeneous magnetic field $B_0$, the nuclei precess, or rotate, about the axis of the $B_0$ field and hence the net magnetization M is aligned with the $B_0$ field axis. The rate, or frequency, at which the nuclei precess is dependent upon the strength of the total magnetic field applied to a particular nucleus, and upon the characteristics of the nuclei specie being subjected to the total magnetic field. The angular frequency of precession, $\omega$, is defined as the Larmor frequency, in accordance with the equation: $\omega = \gamma B_0$, wherein $\gamma$ is the gyromagnetic ratio (and is constant for each nucleus type) and $B_0$ is the strength of the total applied magnetic field to the particular nucleus. Thus, the frequency at which the nuclei precess is primarily dependent upon the strength of the total magnetic field $B_0$; the Larmor frequency increases with increasing total magnetic field strength.

A precessing nucleus is capable of resonantly absorbing electromagnetic energy. The frequency of the electromagnetic energy needed to induce resonance is the same Larmor frequency $\omega$ as the precession frequency $\omega$. During the application of electromagnetic energy, typically by a pulse of radio-frequency (RF) energy, the net magnetization M precesses further away from the $B_0$ field axis (arbitrarily assumed to be the Z-axis of a Cartesian coordinate system), with the amount of precession dependent upon the energy and duration of the RF pulse. A "90°" RF pulse is defined as that pulse of RF energy causing the magnetization M to nutate through an angle of 90° from the direction of the $B_0$ magnetic field, e.g. to move into the X-Y plane (defined by the X-axis and the Y-axis in the Cartesian coordinate system in which the $B_0$ field is aligned along the Z-axis). Similarly, a "180°" RF pulse is defined as that pulse which causes the magnetization M to reverse direction, i.e. move through an angle of 180°, from its original direction (e.g. from the positive Z-axis to the negative Z-axis direction). Following the excitation of the nuclei with RF energy, the absorbed energy is re-radiated as an NMR response signal, as the nuclei return to equilibrium. The re-radiated energy is both emitted as radio waves and transferred to molecules, of the sample being investigated, surrounding each re-radiating nucleus.

NMR response signals originating at different spatial locations within the sample can be distinguished by causing their respective resonant frequencies to differ in some predetermined manner. If one or more magnetic field gradients are applied to the sample, and if each gradient filed is of sufficient strength to spread the NMR response signal spectra in a predetermined manner, then each nuclear spin along the direction of at least one of the field gradients experiences magnetic field strength different from the magnetic field strength experienced by other nuclear spins, and therefore resonates at a Larmor frequency different from that of other nuclear spins, as predicted by the Larmor equation. Spatial position of each nucleus contributing to the total NMR response signal can be determined by Fourier analysis, when coupled with knowledge of the applied magnetic field gradient configuration.

The return of nuclear spins to equilibrium, following RF excitation, is referred to as "relaxation". The relaxation process is characterized by two time constants, $T_1$ and $T_2$, both of which are measures of motion on the molecular level. The spatial distribution of the $T_1$ and $T_2$ constants throughout the sample provides information as to the coupling, or interaction, of the nuclei with their surroundings ($T_1$) or with each other ($T_2$) and both provide useful imaging information.

The time constant $T_1$ is referred to as the "longitudinal", or "spin-lattice", NMR relaxation time, and is a measure of time required for the magnetization M to return to equilibrium; that is, time constant $T_1$ measures the tendency of the nuclear spins to realign themselves with the total field $B_0$, after cessation of RF excitation which has moved the spins away from the $B_0$ field direction. The rate of return to equilibrium is dependent upon how fast the stimulated nuclei can transfer energy to the surrounding sample material, or sample lattice. Time constant $T_1$, for proton ($^1H$) NMR can vary from a few milliseconds in liquids to several minutes or hours in solids. In biological tissue, the typical range of time constant $T_1$ is from about 30 milliseconds to about 3 seconds.

The time constant $T_2$ is referred to as the "transverse", or "spin-spin", relaxation time and is a measure of how long the excited nuclear spins oscillate in phase with one another. Immediately after an RF excitation pulse, the nuclear spins are in phase and precess together; however, each nuclear spin behaves like a magnet which generates a magnetic field that affects other spinning nuclei in its vicinity (generating spin-spin interaction). As each nuclear moment experiences its own slightly different magnetic field, due to the spin of adjacent nuclei, that magnetic moment will precess at a different rate and dephase with respect to the other spins, thereby reducing the observable NMR response signal with a time constant $T_2$. Time constant $T_2$ can vary from a few microseconds in solids to several seconds in liquids, and is always less than or equal to time constant $T_1$. In biological tissue, the typical range of time constant $T_2$, for $^1H$ NMR, is from about 5 milliseconds to about 3 seconds.

If the static magnetic field $B_0$ itself has inherent inhomogeneities, as is typically the case with a field generated by a practical magnet, these inherent inhomogeneities produce additional dephasing action, which hastens the decay of the NMR signal. This additional dephasing action occurs because nuclear spins in different spatial locations are exposed to slightly different magnetic field values and therefore resonate at slightly different frequencies. This new relaxation time, which includes the effects of magnetic inhomogeneities, is generally designated $T_2^*$ ($T_2$ star), where $T_2^* \leq T_2$.

In addition to the effect of spin time constants upon the magnitude of the RF energy re-radiated from a particular nuclei, the frequency of the RF electromagnetic energy re-radiated from any particular nuclei can also be affected by local chemical shifts. Chemical shifts occur where the NMR frequency of resonant nuclei, of the same type in a given molecule, differ because of the different magnetic environments, which are themselves produced by differences in the chemical environment of each of the multiplicity of nuclei. This chemical environment difference may occur, for example, due to electrons partly screening the nucleus of a particular atom from the magnetic field; the nucleus therefore has a somewhat-reduced resonant frequency due to the somewhat-reduced total mangnetic field to which that nucleus is subjected. The degree of shielding caused by electrons depends upon the total environment of the nucleus, and therefore the chemical-shift spectrum of a given molecule is unique and can be utilized for identification. Because the resonant frequency (and therefore the absolute chemical shift) is dependent upon the strength of the total applied field, the chemical-shift spectrum is generally expressed as a fractional shift, in parts-per-million (ppm), of the NMR frequency, relative to an arbitrary reference compound. Illustratively, the range of chemical shifts is about 10 ppm for protons ($^1H$) to about 200 ppm for carbon ($^{13}C$); other nuclei of interest, such as phosphorous ($^{31}P$) for example, have intermediate chemical shift ranges, e.g. 30 ppm. In order to perform chemical-shift spectroscopy, in which such small chemical shifts are discernible, the homogeneity of the static $B_0$ magnetic field must be better than the differences in chemical shifts of the spectral peaks to be observed, and is typically required to be much better than one part in $10^6$ (1 ppm).

Thus, nuclear magnetic resonance investigation offers two non-invasive probes for detection and diagnosis of disease states in an organic sample: proton ($^1H$) magnetic resonance imaging, which can provide images of the internal human anatomy with excellent soft-tissue contrast brought about by the relatively large differences in NMR relaxation times; and localized phosphorous ($^{31}P$) and carbon ($^{13}C$) chemical-shift spectroscopic imaging to provide direct access to metabolic processes for the assessment of damaged tissue and its response to therapy. In addition, the feasibility of imaging naturally-abundance sodium ($^{23}Na$) and artifically-introduced fluorine ($^{19}F$) has recently been demonstrated and may find clinical applications in the near future. It is well known that the magnetic field requirements for $^1H$ imaging can be met at static field strengths below 0.5 Tesla (T) and that spectroscopy typically requires a magnetic field strength in excess of 1 T, with a much higher degree of homogeneity across the examination region than required for imaging. It is also well known that the signal-to-noise ratio of the NMR signal improves with increasing magnetic field strength, if the rest of the NMR system is optimized. It has been widely speculated, in the literature of the art, that human head and body proton imaging is not feasible above a main field strength of about 0.5 T, owing to the dual problems of RF field penetration into the sample to be investigated and to the difficulty of NMR coil design, at the relatively high NMR frequencies associated with the higher-magnitude static fields. Therefore, by at least implication, a single magnetic resonance system having a single high magnetic field magnitude, in excess of about 0.7 T, for producing proton images and localized chemical-shift spectra from anatomical samples, such as the head, limbs and body of human beings, has been considered experimentally incompatible. A system enabling the performance of both high-field NMR imaging and chemical-shift spectroscopy for medical applications with the human body, and for the analysis distribution of non-ferromagnetic samples (e.g. for analysis and distribution of hydrocarbon deposits and oil-bearing shale sediments, for general morphological and chemical analysis of heterogeneous non-ferromagnetic samples, and the like) is highly desirable. Such a system requires more stringent excitation control and response analysis parameters than a system operating at a lower field or operating in only one of the imaging or spectroscopic regimes. The digital subsystem, having direct control over almost all system variable parameters, must be capable of properly utilizing the magnetic assets of the system to effect superior imaging and spectroscopic analysis.

BRIEF SUMMARY OF THE INVENTION

In accordance with the invention, a novel digital interface subsystem for a magnetic resonance imaging system for the production of images and localized chemical-shift spectra from a non-ferromagnetic sample, such as anatomical portions of human beings and the like, comprises: means for receiving externally-provided input data; means responsive to the input data for providing a sequential set of operating instructions; means for generating at least one gradient-field-determining signal and for generating at least one radio-frequency-waveform-determining signal; means for providing each of the generating means signals to said system; means for receiving at least one analog MR response signal from said system; means for digitizing the at least one response signal; and means for interacting with all other means to control the operation of all of the subsystem in accordance with the sequential operating instruction set provided by the system.

In our presently preferred embodiment, three separate gradient signals are provided to a gradient switch, to allow different imaging views to be controlled from the system computer. A plurality of means for generating a gradient field along one preselected imaging axis are provided, as are a like plurality of means for providing an RF envelope waveform for a signal associated with that imaging axis, so that rapid switching of gradient field and RF signals can be carried out under system computer control. Preferably, all RF and gradient field parameters can, as a minimum, be controlled by the data externally provided to the digital subsystem.

Other aspects of our invention include the methods for applying specific combinations of radio-frequency and magnetic gradient field signals for the production of two-dimensional (single-slice) and three-dimensional (multiple-slice) images, transverse and relaxation time images and chemical-shift spectroscopic images of $^1H$, $^{13}C$, $^{23}Na$ and/or $^{31}P$ nuclei and the like.

Accordingly, it is one object of the present invention to provide a novel digital interface subsystem for a magnetic resonance imaging system, and capable of enabling the production of both nuclear magnetic resonance images and localized chemical-shift spectra in a single-static-magnetic field system.

This and other objects of the invention will become apparent to those skilled in the art, upon a perusal of the following detailed description, when considered in conjunction with the drawings.

BRIEF SUMMARY OF THE DRAWINGS

FIGS. 3-7 are graphical illustrations of the various signals typically found at various points within the system for several presently preferred and different methods of producing NMR images and localized chemical shift spectra from anatomical samples, as controlled and provided by the digital interface subsystem of the present invention.

DETAILED DESCRIPTION OF THE INVENTION

In order to more properly appreciate the digital interface subsystem of the present invention, an overview of a presently preferred nuclear magnetic resonance system embodiment, generally controlled by the digital interface subsystem, will first be described.

THE NMR SYSTEM

Figure 1:
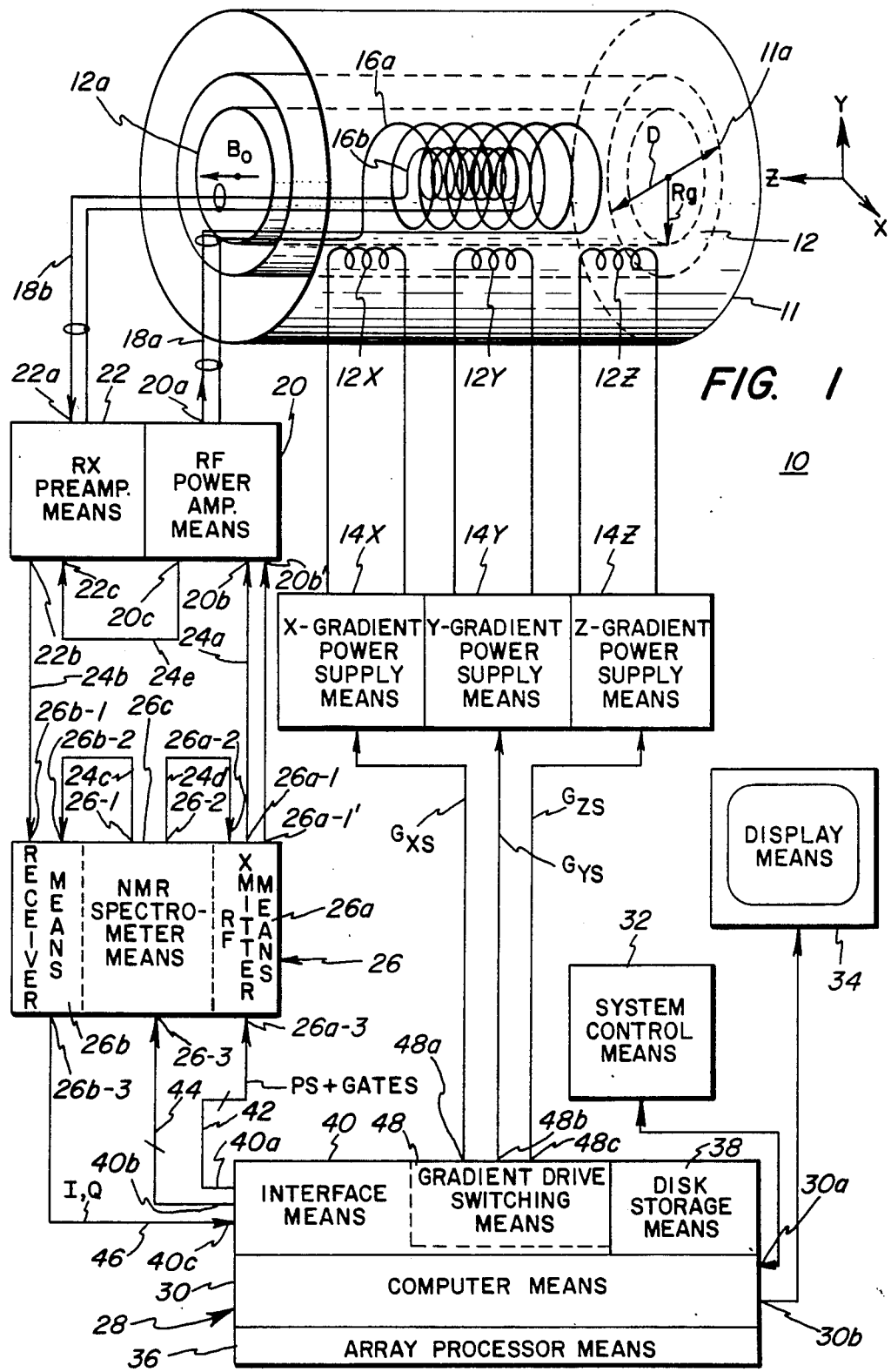
FIG. 1 is a schematic block diagram of a high-field NMR system in which the digital subsystem of the present invention is used.
Figure 1A:
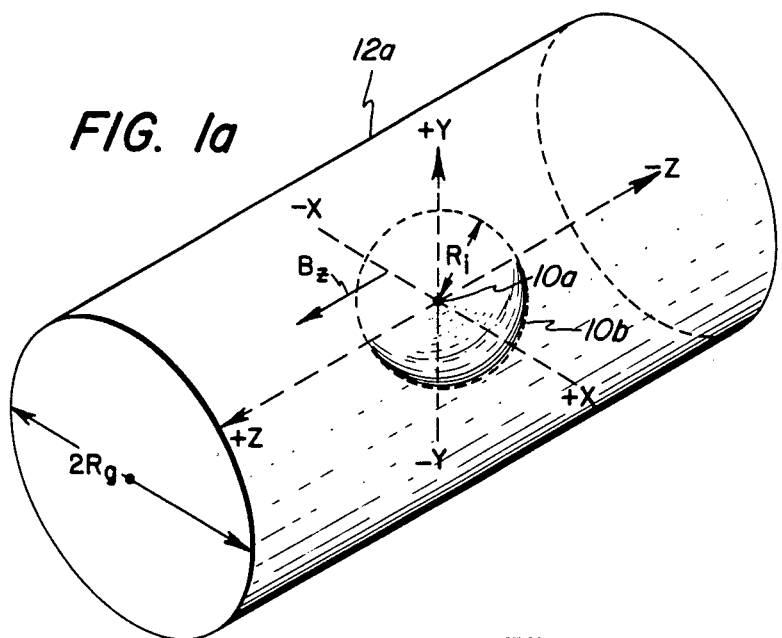
FIG. 1a is a perspective view of the bore of the NMR system magnet means, defining the various imaging coordinates and volumes.

Referring initially to FIGS. 1 and 1a, the magnetic resonance imaging and spectroscopy system 10 utilizes a superconducting magnet means 11 having a room-temperature inner bore 11a of a diameter D, between about 0.4 meters and about 1.5 meters. Magnet means 11 provides a single static magnetic field $B_0$ along the axis of the cylindrical bore 11a; the magnitude of field $B_0$ must be sufficiently high, i.e. not less than about 0.7 Tesla (T), to facilitate production of localized chemical-shift spectra and has an upper limit, i.e. presently about 4 T, established only by available magnet technology for providing a high-field magnet having a useable bore diameter D. Magnet means 11 may be a superconducting magnet having main magnet coils and a set of a plurality of correction coils immersed in liquid helium, with another set of a plurality of resistive correction coils. The magnet means has a bore provided by a nonconductive tube which is lined with a thin cylinder of a conductive material to provide shielding for the RF magnetic fields. The resulting room-temperature free bore 11a has a diameter D of about 1 meter. An axial static field $B_0$ of high spatial and temporal linearity and stability is provided at a magnitude of about 1.5 T. The static magnetic field $B_0$ is assigned to the Z axis of a three-dimensional Cartesian coordinate system, wherein the X and Y directions are orthogonal to one another and to the Z axis.

Within the magnet means free bore 11a are gradient coil means for generating a set of linear magnetic field gradients in the main static $B_0$ field, relative to the three principal Cartesian coordinate axes. Gradient coil means 12 are typically confined to an annular cylindrically-shaped volume, having a gradient coil means free bore 12a, with a gradient bore radius $R_g$ which is less than the magnet means inner bore radius (i.e. $R_g$ is less than $D/2$) but is typically not less than about 0.3 meters. Within the annular cylindrical volume, disposed with its axis along the Z axis of the magnet means free bore, are disposed suitable means for providing a magnetic field gradient in each of the three Cartesian coordinate axes; the three gradient field-forming means are schematically illustrated as coil means 12X for forming a magnetic field gradient $G_X$ ($=\partial B_0/\partial x$) relative to the X coordinate axis, coil means 12Y for forming a magnetic field gradient $G_Y$ ($=\partial B_0/\partial y$) relative to the Y coordinate axis, and coil means 12Z for forming a magnetic field gradient $G_Z$ ($=\partial B_0/\partial z$) relative to the axial Z coordinate axis. While coil means 12X, 12Y and 12Z are schematically shown as having common axes, it should be understood that this positioning is for purposes of diagrammatic simplicity only; the actual position and type of gradient field generating means (which may be coils having saddle-shaped, Maxwell pair, or other distributed current winding geometries) is well known to the magnetic resonance imaging art. The only requirement of gradient coil means 12X, 12Y and 12Z is that the means utilized be capable of generating magnetic field gradients in the main applied field $B_0$, which magnetic field gradients may be linear, or otherwise, with respect to the Cartesian coordinate axis associated with each gradient coil means and which magnetic field gradient may be pulsed, or otherwise modulated, as required for the particular magnetic resonance experiment to be conducted.

The magnet means 11 and gradient coil means 12 thus provide a total magnetic field $B_Z$ (FIG. 1a) within the gradient coil means free bore 12a, which total field $B_Z$ is a summation of four separate fields: the static field $B_0$ in the Z axial direction, and gradient fields in the X, Y and Z directions which typically vary linearly with distance along the associated axis. Thus, the total $B_Z$ field is given by:

$$B_Z = B_0 + G_X \cdot x + G_Y \cdot y + G_Z \cdot z,$$

where $G_X = (\partial B_Z/\partial x)$, $G_Y = (\partial B_Z/\partial y)$ and $G_Z = (\partial B_Z/\partial z)$ and where $G_X$, $G_Y$ and $G_Z$ can be of either polarity. The origin 10a of the Cartesian coordinate system is usually chosen as the center of the region of highest homogeneity of the mean static field $B_0$. As shown in FIG. 1a, this point usually corresponds substantially to the midpoint along the length of the bore in each of the three Cartesian directions, although it should be understood that, by variation of the ratio of currents in different portions of each of the $G_X$, $G_Y$ and $G_Z$ gradient coil means, the center 10a of a sample sphere 10b can be moved to any desired location within the imaging cylinder 12a.

Thus, the sampling sphere can be moved to various Z-axis locations, especially if it is inconvenient or impossible to move the sample (a human body and the like), for any reason, in any one of the X, Y or Z directions to place the sampling volume of interest at the sample sphere center point 10a. The sample sphere 10b has a radius $R_f$ determined by the particular form of magnetic resonance experiment being carried out; typical sample sphere radii are about 5 centimeters for chemical-shift spectroscopy experiments and between about 15 and about 25 centimeters for proton imaging. The linearity of the static $B_0$ field is established by the main and correction windings of the superconducting magnet means 11 and, for a dual imaging/spectroscopy system at a static magnetic field value of about 1.5 T should have a maximum spatial deviation of about 2 parts per million (ppm) across the 5 cm. spectroscopy sample sphere. In addition to a high degree of spatial linearity, a very small value of deviation of the static magnetic field with time (i.e. high temporal stability) is also required, because typical experiments require a relatively long time, ranging from tens of seconds to tens of minutes, to complete; the higher the temporal stability, the better the spatial resolution of images and the spectral resolution in spectroscopy.

The X, Y and Z magnetic field gradients $G_X$, $G_Y$ and $G_Z$ are also subject to spatial and temporal constraints by the imaging/spectroscopy procedures used. Two aspects of the gradient fields of importance are the spatial linearity, which is a function of the gradient coil itself, given a constant coil current flow; and the temporal response of the gradient field to an electrical current impulse, which is a function of the time constants of the electronic circuitry supplying the gradient current to the associated gradient coil, the time constants of the gradient coil and the electrical and magnetic characteristics of its environment. The gradient field spatial linearity must be provided solely by the design of the gradient coil itself; many forms of highly volume-linear gradient coils are known, such as, for example, the gradient field coils described and claimed in co-pending application Ser. No. 548,174, filed Nov. 2, 1983, now U.S. Pat. No. 4,646,024, issued Feb. 24, 1987, assigned to the assignee of the present application and incorporated herein in its entirety by reference. The gradient field temporal response, while having some relation to the time constants of the gradient coils themselves, is also affected by eddy currents in the surrounding structure, which introduce time-dependent, interfering field perturbations, and only minimally affected by the time constants of the circuitry supplying the gradient-determining current to the associated gradient coil means. For a system utilizing the illustrated Cartesian coordinates, with the gradient field in the direction of each axis being associated with a set of gradient coil means, a separate one of a plurality of gradient power supply means 14 is utilized to establish the gradient current through each associated axis coil means responsive to the instantaneous value of a gradient signal $G_{AS}$, where A is the particular axis direction. Thus, an X-gradient power supply means 14X supplies to the X-axis gradient coil means 12X a $G_X$-gradient-forming current of magnitude and polarity determined by the magnitude and polarity of an input gradient $G_{XS}$ signal; a Y-gradient power supply means 14Y supplies to the Y-axis gradient coil means 12Y a $G_Y$-gradient-forming current of magnitude and polarity determined by the magnitude and polarity of an input gradient $G_{YS}$ signal; and a Z-gradient power supply means 14Z supplies to the Z-axis gradient coil means 12Z a $G_Z$-gradient-forming current of magnitude and polarity determined by the magnitude and polarity of an input gradient $G_{ZS}$ signal. Each of the gradient-forming signals $G_{XS}$, $G_{YS}$ and $G_{ZS}$ is typically of pulsed nature; the amplitude transfer characteristics of each gradient power supply means 14 may be entirely linear or may be deliberately established as a predetermined non-linear transfer function, as required to provide a linear gradient magnetic field in each of the X, Y or Z directions responsive to the actual driving signal provided thereto. The transfer function of each of the gradient power supply means and its associated gradient coil can be made perfectly linear, whereby a perfectly linear gradient magnetic field is provided for a perfectly linear gradient power supply means input signal, or can be non-linear in any desired monotonic manner. Due to the relatively low duty cycles of the pulsed audio-frequency gradient coil currents required, our system uses power supply means having about 2 KW. output power capability and a bandwidth from DC to about 40 KHz for each gradient coil axis.

The total magnetic field $B_Z$ acting on each small volume element (voxel) of the sample establishes the exact Larmor frequency of that small volume in conjunction with the gyromagnetic constant $\gamma$ for a particular nuclei species being investigated. That is, a particular species of nuclei, all of which are bound in the same chemical environment, will have identical Larmor frequencies in a uniform magnetic field, but, responsive to the changing magnetic field provided by the field gradients, will have Larmor frequencies occurring over a range, responsive both to the gradient magnitude and polarity and to the position of the volume element containing the radiating nuclei within the total field. The nuclei are initially stimulated by excitation radio-frequency (RF) energy at the Larmor frequency determined by the species gyromagnetic constant and the total field at the sample volume; this RF energy enters the sample from an RF magnetic field provided by an excitation antenna 16a. The RF energy is provided to antenna 16a via an excitation cable 18a, typically of coaxial construction, from the output 20a of an RF power amplifier means 20. Responsive to the excitation RF magnetic field, the various small nuclei voxels each reradiate an RF signal at the Larmor frequency determined by the total instantaneous field magnitude at the species sample location. This reradiated signal is received by a reception antenna 16b and is provided via a cable 18b, also typically of coaxial construction, to the input 22a of a reception RX preamplifier means 22. Excitation antenna 16a and reception antenna 16b may both surround the anatomical sample being investigated and are always placed within the magnet means bore 10a. Because the gradient coils 12 are typically of a size and construction providing some degree of disturbance to the radiation patterns of the reception and transmission antennae 16, the antennae 16 are typically placed within the free bore 12a of the gradient coils. Further, it is often necessary, when providing antennae 16 as solenoidal coils and the like, to have the excitation antenna 16a of somewhat greater diameter than the reception coil 16b, to provide a desired uniformity of excitation RF magnetic field across the sample volume to be investigated. It should be understood that a large variety of forms of excitation and/or reception antennae are known and any such form utilizable at Larmor frequencies associated with imaging and/or spectroscopy experiments can be used; considerations of spatial and temporal linearity and stability, as well as sensitivity, may affect the choice of a particular antenna, or antennae, for a particular experiment.

RF power amplifier means 20 supplies the excitation signal responsive to a transmitter RF signal provided at the power amplifier means input 20b, via a cable 24a, from the RF output 26a-1 of an RF transmitter means portion 26a, forming part of an NMR spectrometer 26. The signal at transmitter means portion output 26a-1 is, as further described hereinbelow, provided at an instantaneous frequency determined by the frequency of a signal provided at a second transmitter means portion input 26a-2, and with a modulation envelope of shape and timing determined by RF pulse-shape (PS) determining and gating signals provided at a second RF transmitter means portion input 26a-3.

The response signals received at preamplifier means input 22a are, after low-noise amplification in means 22, provided at an output 22b thereof and coupled, via another cable 24b, to a preamplified signal input 26b-1 of a receiver means portion 26b of NMR spectrometer means 26. Within receiver means portion 26b, the preamplified signal is compared to a local oscillator frequency, provided at a second receiver means portion input 26b-2, to provide a pair of phase-quadrature I and Q signals at a receiver means portion output 26b-3. Power amplifier means 20 provides a gating signal at a third output 20-c, via a cable 24e, to a second input 22c of the preamplifier means 22, for temporarily disabling, and protecting, the preamplifier means whenever an excitation pulse is being provided by power amplifier means 20.

A common portion 26-1 of the NMR spectrometer means 26 not only provides the RF local oscillator signal to the receiver means portion input 26b-2, via a cable 24c from a first RF output 26-1 of the spectrometer common portion 26c, but also provides the same frequency, via another cable 24d from a second RF output 26-2 of common portion 26c, to the transmitter means first input 26a-2. The particular frequency is selected responsive to at least one frequency-determining signal at a control input 26-3 of spectrometer common portion 26c. It will be seen that, while means 26 is denoted as an NMR "spectrometer", this means is used for all NMR experiments, of imaging as well as chemical-shift spectroscopy nature. It should be understood that, because power amplifier means 20 and low-noise preamplifier means 22 are best utilized with relatively short lengths of cables 18a and 18b, these means may not be physically located at the same location as means 26, and are semantically distinguished from the "spectrometer" only to highlight this difference in location; those skilled in the art may equally as validly refer to all of means 20, 22 and 26 as an "NMR Spectrometer" without violating the spirit or intent of the present invention.

System 10 includes a data processing and control means 28, comprised of a computer means 30, having a first input/output (I/O) port 30a for communications with a systems control means 32 (such as a keyboard device and the like), and an output port 30b for providing video information and the like signals to a display means 34, for providing a temporary display of the information acquired from the anatomical sample being investigated. Data processing and control means 28, in addition to computer means 30, comprises: an array processor means 36 so coupled to computer means 30 as to provide relatively rapid fast Fourier transform (FET) calculations and the like upon data transferred thereto from the computer means; a disk storage means 38 for providing semi-permanent storage and retrieval of relatively large amounts of digital information (e.g. the sample information from each of a multiplicity of sample experiments); and a digital interface subsystem 40 serving to interconnect the computer means 30 with the NMR spectrometer means 26 and the plurality of gradient power supply means 14.

THE DIGITAL INTERFACE SUBSYSTEM

Digital interface subsystem 40 has a first output port 40a for providing, via a plurality of signal-carrying conductors 42, the various pulse-shape-determining and pulse gate signals to be transmitted to the control input 26a-3 of transmitter means portion 26a. A second digital interface subsystem output port 40b provides, via a plurality of conductors 44, the relevant computer data channel signals to spectrometer input 26-3 for establishment of spectrometer frequencies and the like common information. A digital interface system first input port 40c receives, via a plurality of cables 46, the quadrature I and Q signals from the output 26b-3 of receiver means portion 26b. Digital interface subsystem 40 also, advantageously, comprises a gradient drive switching means 48 (further described and claimed in the above-mentioned application Ser. No. 743,115), which receives information describing the gradient magnetic fields to be established within the gradient coil bore 12a and provides the proper gradient drive signals $G_{XS}$, $G_{YS}$ and $G_{ZS}$ at the respective gradient drive signal output ports 48a, 48b and 48c to the respective X-gradient power supply means 14X, Y-gradient power supply 14Y and Z-gradient power supply means 14Z.

Figure 2:
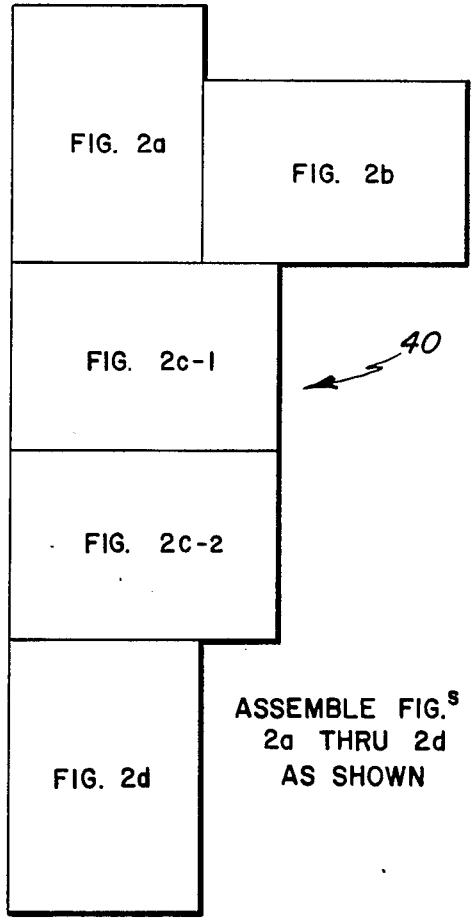
FIG. 2, comprised of the schematic block diagrams of FIGS. 2a-2d, illustrates a presently preferred embodiment for the novel digital interface subsystem of the present invention.
Figure 2A:
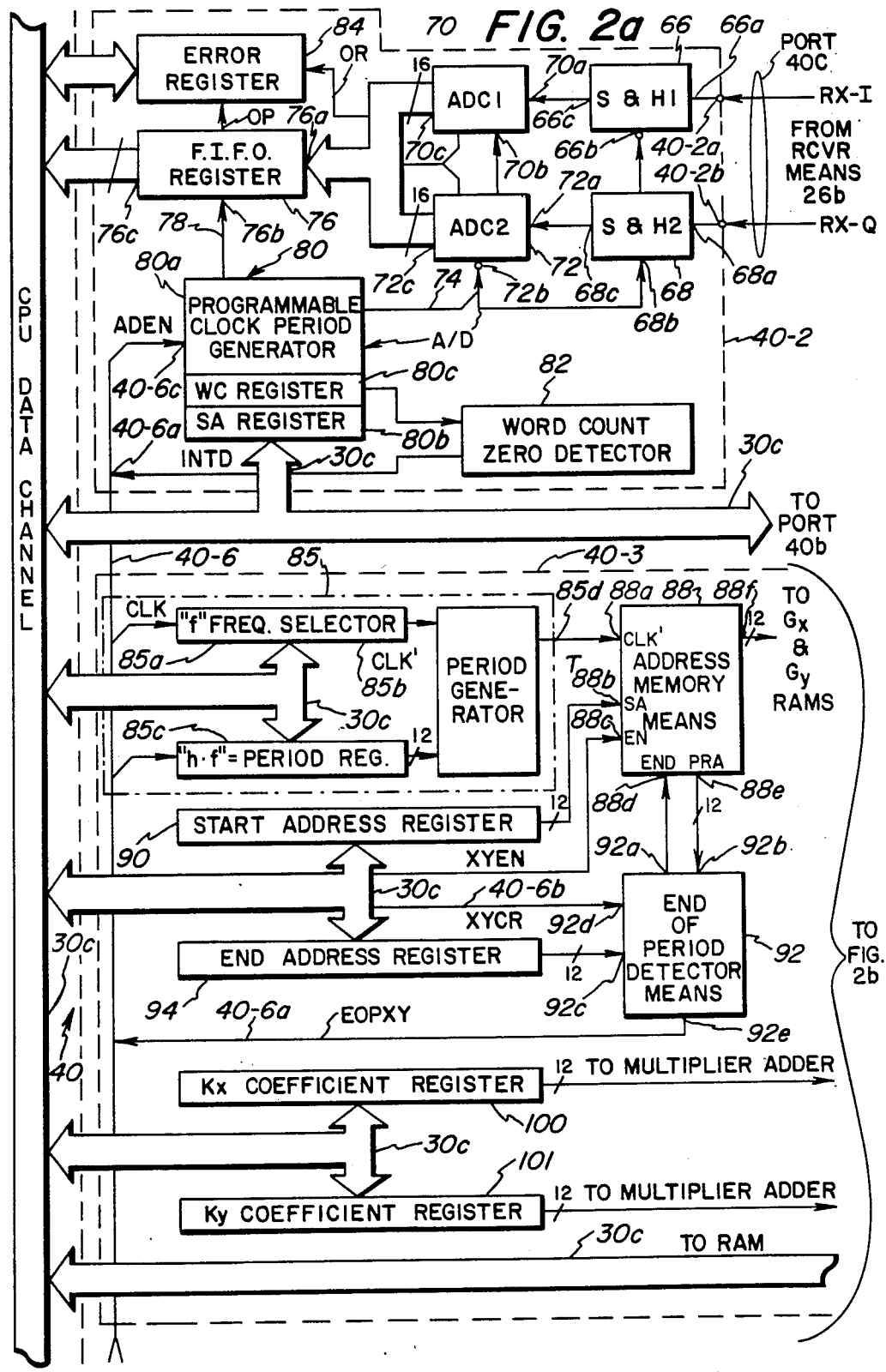
FIG. 2e is a schematic illustration of the 64-bit data word format transferred via the data bus in the digital interface subsystem of FIG. 2, and useful in appreciating the principles of operation of the digital interface subsystem.
Figure 2B:
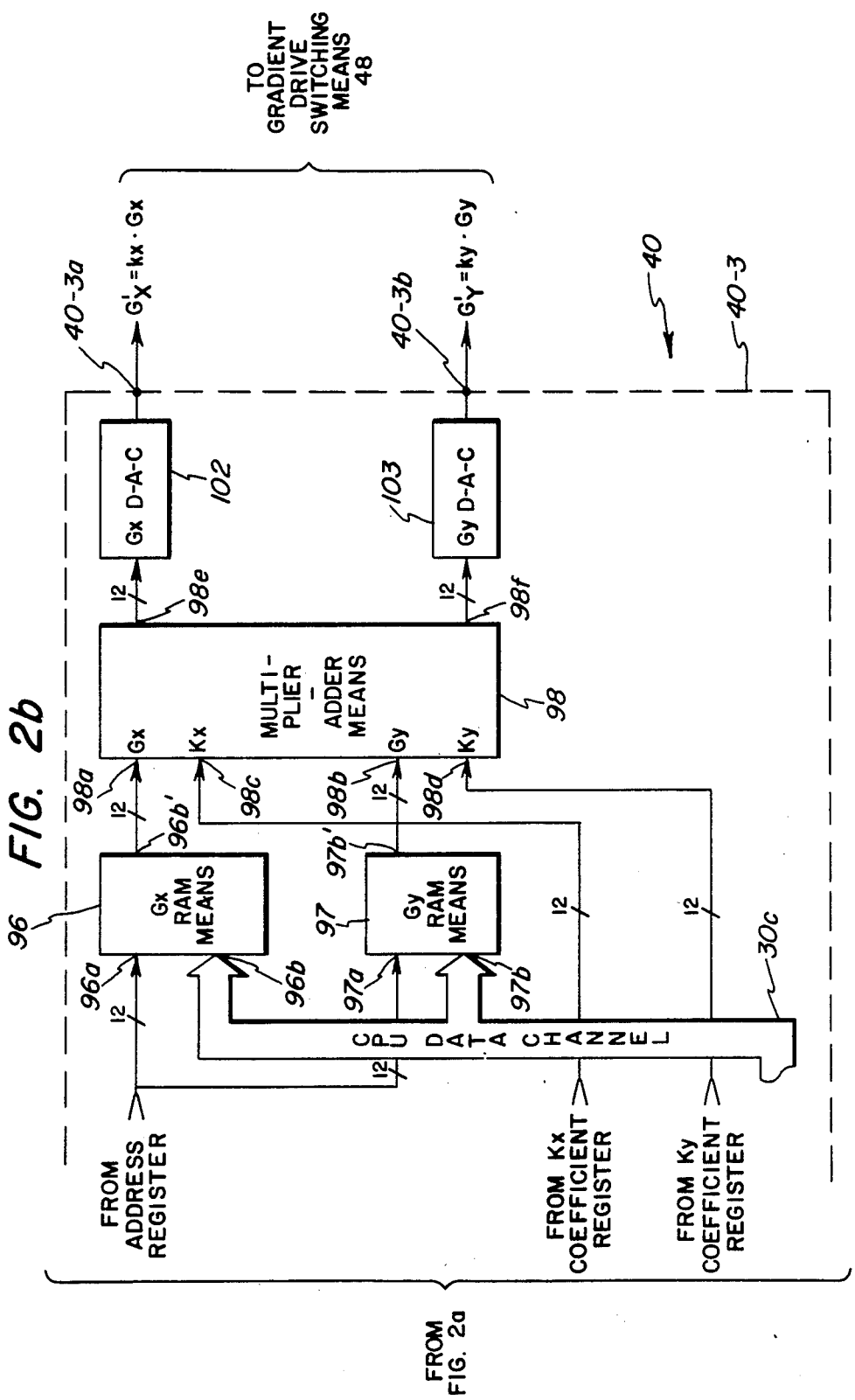
Figures 1, 2C:
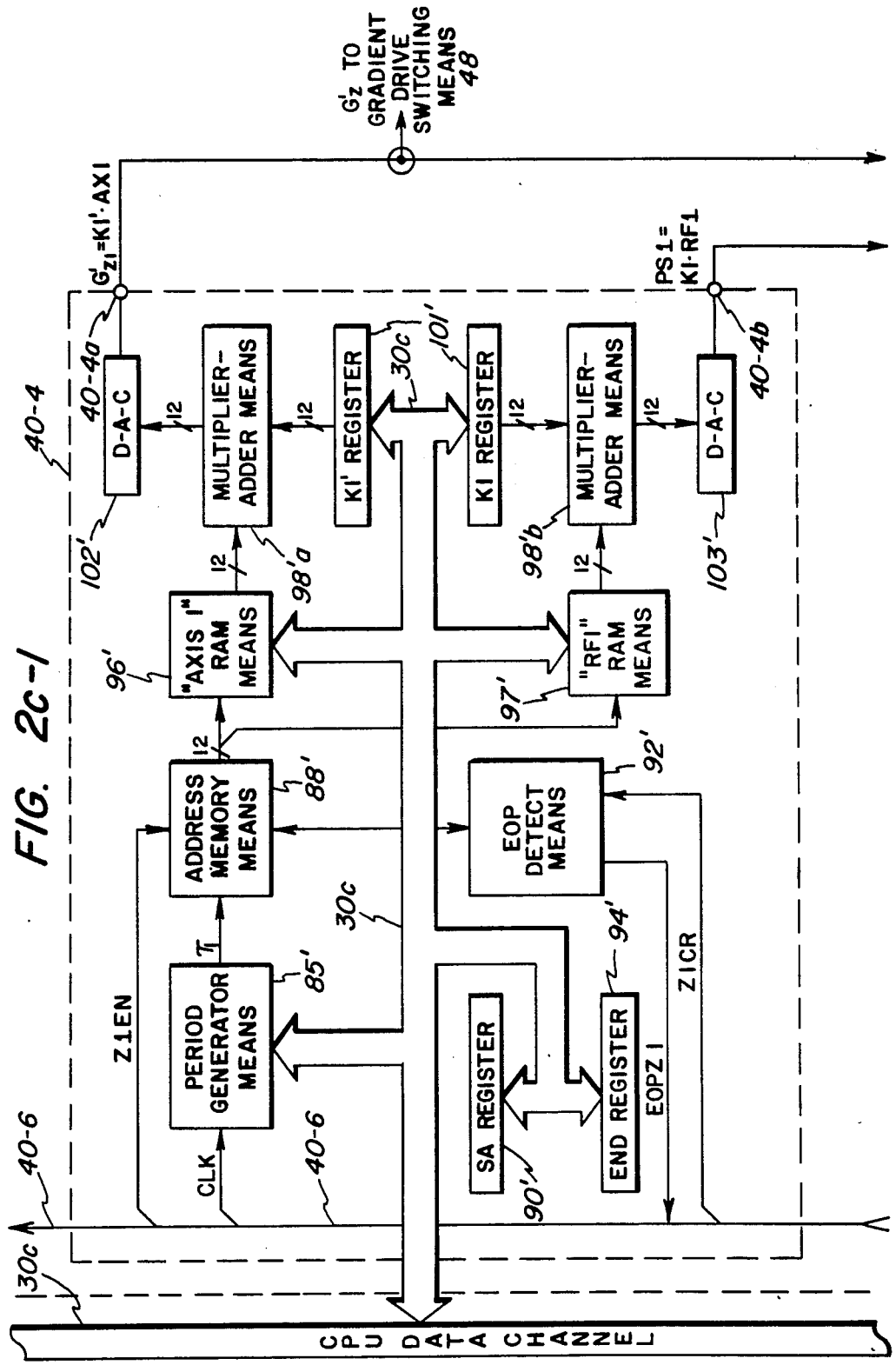
Figures 2, 2C:
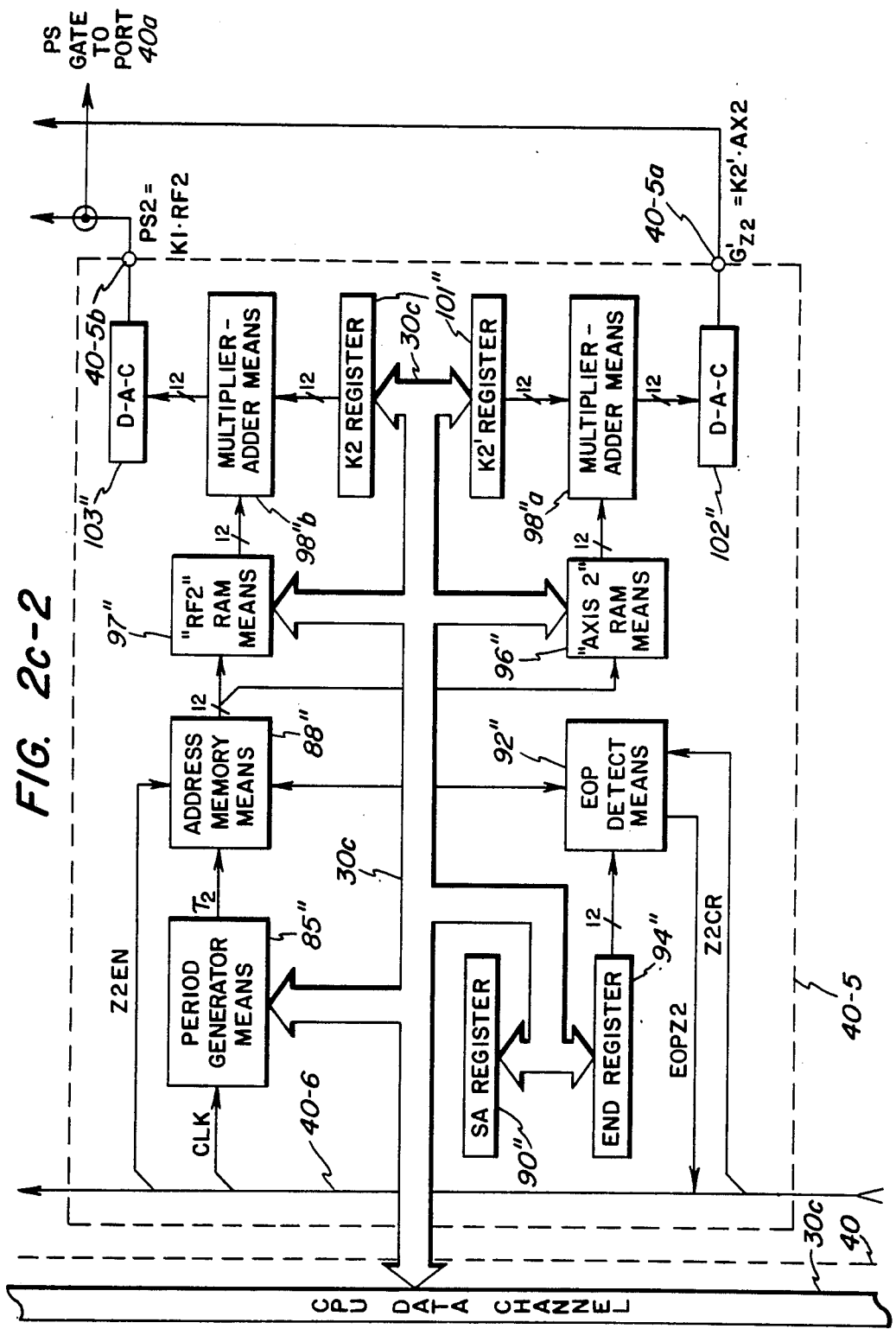
Figures 2D, 2E:
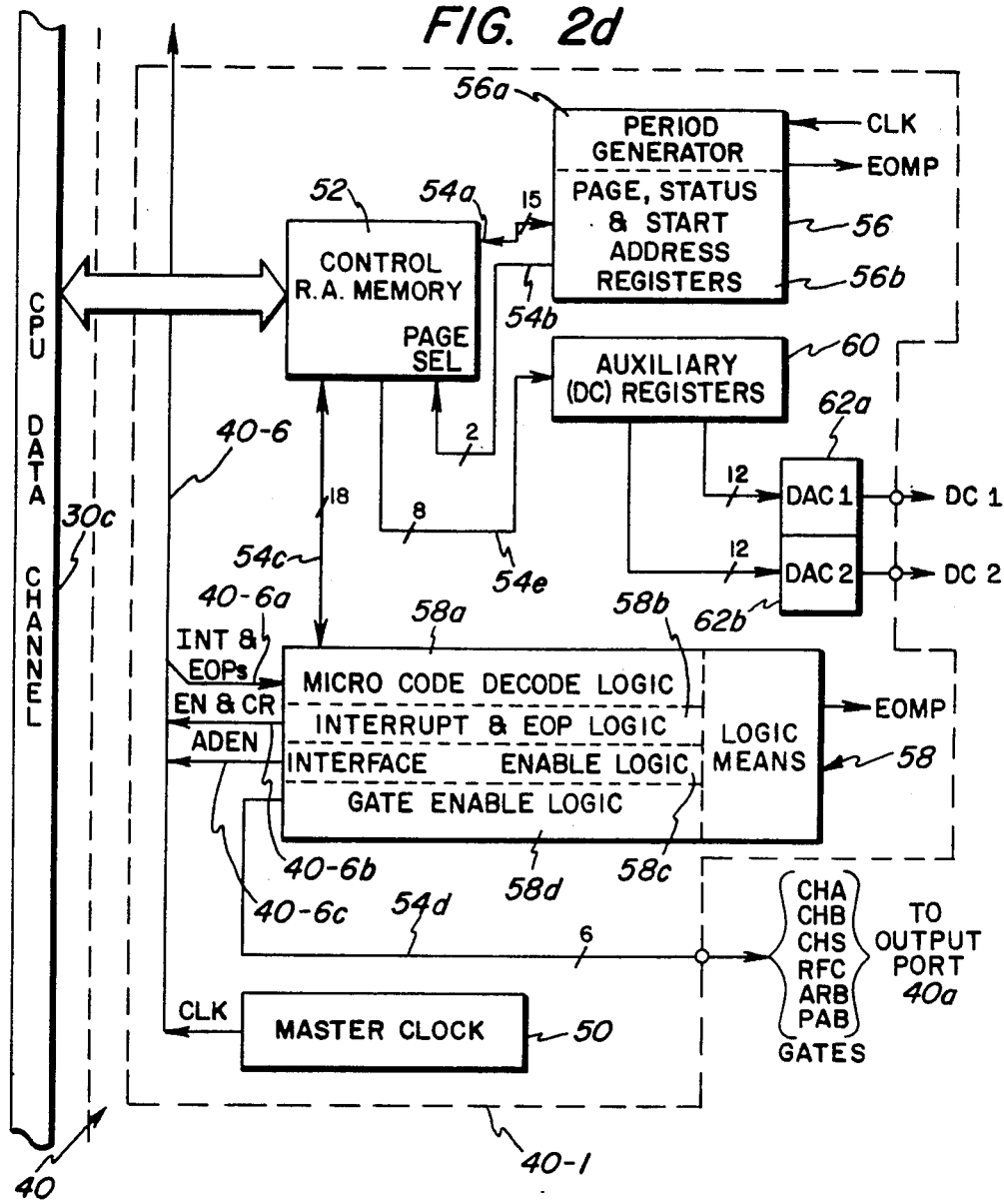

Referring now to FIGS. 2a–2d, joined together as shown by FIG. 2, and to FIG. 2e, digital interface subsystem 40 receives digital information from the computer means central processor unit (CPU) data channel 30c: for providing gradient field signal waveforms $G'_X$, $G'_Y$ and one of a pair of Z-gradient-field signal waveforms $G'_{Z1}$ and $G'_{Z2}$ to means 48; for providing the pulse-shape and gate signal waveforms to output port 40a (and thence to spectrometer transmitter means portion input 26a-3); for providing frequency and other common information to output port 40b (and thence to spectrometer input 26-3); and for processing the quadrature I and Q video signals provided from spectrometer receiver means portion output 26b-3. The following illustrative example of our novel digital interface subsystem 40 is a presently preferred embodiment which is utilized with a general-purpose Data General type S/140 minicomputer (as computer means 30) and with a Floating Point Systems type AB120B high-speed array processor (means 36) in a 1.5 T superconducting imaging/spectroscopy system. Data channel 30c is a 16-bit-wide data bus. Bus 30c provides minicomputer-generated data to: an interface master sequencer portion means 40-1; a digitizer portion means 40-2; an interface first-type waveform-generator portion means 40-3; a pair of interface second-type waveform-generator portion means 40-4 and 40-5; and to the digital interface subsystem second output port 40b. Digital interface subsystem 40 also comprises a subsystem internal data bus 40-6 having a plurality of conductors interconnecting the master sequencer portion means 40-1 with, and for control of, digitizer portion means 40-2 and waveform-generator portion means 40-3, 40-4 and 40-5. Bus 40-6 is implemented as a 35-bit-wide bus in the illustrated embodiment.

Master sequencer portion means 40-1 comprises a master clock means 50 for providing an internal clock (CLK) signal periodic waveform (illustratively at about 10 MHz.) to all of the interface means portions. A control random-access memory means 52 stores microcode instructions, downloaded from minicomputer means 30, for controlling the operational sequences of digitizer portion means 40-2 and waveform-generator portion means 40-3, 40-4 and 40-5. Thus, the microcode instructions contained in each one of four 256-word pages of memory means 52 will determine the order in which the waveform-generator portions are enabled, the length of various time intervals in the pulse sequence signal waveforms, the controlled flow of operational sequences which require nested or alternative subsequences, data acquisition times and the like. Coupled to CPU data channel 30c and to control memory means 52, via a data bus 54a and a page-selection bus 54b, is a period generator and page, status and start-address registers means 56. The period generator portion 56a receives CPU data from memory means 52 and receives the master clock CLK signal from means 50. Also coupled to control memory means 52, via an 18-bit bus 54c, is a logic means 58. Logic means 58 contains four logic portions: a microcode decode logic portion 58a which receives the microcode instructions from memory means 52, decodes the microcode instructions and causes the proper sequence of operations to occur responsive thereto; an interrupt (INT) and end-of-period (EOP) logic portion 58b, which receives INT and EOP signals from a portion 40-6a of the subsystem internal bus; an interface enable logic portion 58c, which provides enable (EN) and continuous-run (CR) signals to the waveform-generator portions 40-3 through 40-5, via a portion 40-6b of the subsystem bus, and provides a digitizer portion means 40-2 enable (ADEN) signal via another subsystem bus portion 40-6c; and a gate enable logic portion 58d which provides the six gate signals (signals CHA, CHB, CHS, RFC, ARB and PAB), as hereinbelow further explained, on a six-connection bus 54d to digital interface subsystem output port 40a. Control memory means 52 is also connected via a multi-bit bus 54e to an auxiliary, or data control (DC), registers means 60, which itself provides a pair of 12-bit digital words to an associated one of a pair of digital-to-analog conversion means 62a or 62b, themselves providing auxiliary analog signals DC1 or DC2 from the master sequencer portion.

The 64-bit microcode data word has a format, as shown in FIG. 2e, containing five fields. The first 16 bits (i.e. bits b0–b15) form a period generator field which initializes period generator portion 56a to select an output signal waveform of period and/or frequency to be generated during a time interval commencing with the availability of that data word (i.e. when the control memory 52 receives the address of that data word from an register portion 56b) and terminating at the end of the time interval selected by the period generator field for that particular data word. The 16-bit period generator field, coupled with an interval six-decade divider (discussed in further detail hereinbelow) allows each control memory word to be present during any interval from 0.1 microseconds to at least 409.6 seconds. The enable (EN), interrupt (INT) and synchronization (sync.) field is an 8-bit field (i.e. bits b16–b23) which is further subdivided into 8 single-bit subfields to provide the enable, continuous-run, end-of-period interrupt, accept external synchronization and next control memory word address conditions for a present control data word instruction. Separate data bit subfields are provided to, inter alia, initially enable and/or set for continuous run the XY-gradient generator portion means 40-3; enable the digitizer portion means 40-2; issue an interrupt at any end-of-period (EOP) signal from any of the other interface means portion means 40-2 through 40-5; cause all portion means 40-1 through 40-5 to cease operation upon generation of an EOP signal; cause the master sequencer means control memory address to advance to a selected one of the next address or an alternate control memory address, upon generation of an EOP signal; and similar functions. In conjunction with the period generator field, the next 8-bit field (i.e. bits b24–b31) contains the next master sequencer control memory address, which will be called unless a jump to an alternate control memory address is specified in the jump subfield. Since each next-address field is of only 8-bit width, the next address specified must be upon the same 256-word page as the previous address, unless the page register in portion 56b is updated by the CPU, during the period when a present data word is being executed. The data word format ends with a pair of 16-bit fields for respectively controlling the Z1 or Z2 gradient generators and different respective trios of the six gate signals to be made available at interface means output port 40a. Each of the last two fields also provides a 4-bit subfield, which is transmitted via bus 54e to the auxiliary (DC) registers means 60, for selecting the appropriate one of a plurality (e.g. 12) of the auxiliary registers to provide the 12-bit data input to one of DAC means 62a or 62b. The data-correction DC output(s) thus provided can be any auxiliary analog signal(s).

Master sequencer portion means 40-1 is thus responsible for performing the following functions:

(1) generating a clock CLK signal (e.g. at 10 MHz.) for synchronization of all interface portion means 40-1 through 40-5;

(2) determining the basic timing relationships between the gradient, gating and other signal waveforms generated by the various interface portion means 40-1 through 40-5;

(3) enabling and disabling other interface portion means 40-2 through 40-5 at specified times;

(4) clocking out "dead" time intervals when none of the other interface portion means 40-2 through 40-5 are enabled;

(5) generating interrupts to the computer means CPU at specified times;

(6) controlling the logic levels of six logic (TTL) gate signals which are used for various system utility functions, such as spectrometer means 26 control, RF excitation signal gating, receiver blanking and the like;

(7) determining whether the system is in a "run" mode wherein waveforms and control signals are being actively generated, or whether the system is in a "dormant" mode wherein those signals are not being generated and digital interface subsystem 40 is dormant and awaiting instructions from computer means 30, via CPU data channel 30c; and (8) selecting two of a multiplicity of auxiliary DC registers 60 to be gated into the pair of 12-bit DAC means 62 for providing analog signal outputs for use in those parts of the system, such as DC magnet compensation and the like, where response speed is not a critical factor.

In normal operation, the control memory and the page/address registers are downloaded with program information via the CPU data channel 30c. Each control program must fit within one of the four 256-word pages, so that four distinct NMR experiment programs can simultaneously reside in the control memory. Upon receipt of a start signal, master sequencer means 40-1 commences operation and the page and starting address information in register portion 56b is used to select the control memory address to provide a first instruction to logic means 58. Once master sequencer means 40-1 is running, computer means 30 can obtain the status thereof from the status registers in portion 56b. Master sequencer means 40-1 enables, responsive to the signals in the various fields of the data word then provided to logic means 58, the various ones of the output signals to be generated from portion means 40-1 through 40-5 and determines the timing of the various signals generated responsive to the present data word. Master sequencer portion means 40-1 will remain at a particular control memory address, and a particular data word will be acted upon, until the interrupt and EOP logic portion 58b receives either an end-of-master-period (EOMP) overflow signal from the period generator portion 56a of master sequencer means 40-1 or an EOP signal from one of the gradient waveform-portion means 40-3 through 40-5. At the occurence of either event signaling the end of a predetermined time interval, the control memory jumps to a new memory address. While this next address will usually be the next address specified in the data word field of bits b24–b31, the control memory will jump to an alternate address if the "enable alternate address" subfield of the EN,INT and sync. field is enabled and an alternate address has been loaded (via data channel 30c) into an alternate address register in portion 56b, while a previous data word was controlling the master sequencer. If an alternate address has not been loaded, the master sequencer board halts; the system remains in the "run" mode (until turned off by an instruction from computer means 28 to the appropriate register of means 56) thus enabling the computer means to force the master sequencer means to exit an instruction loop without disturbing the system timing.

It will be seen that since either an EOP signal generated by one of portion means 40-2 through 40-5, or the elapsing of the time period determined by the master sequencer portion means period generator portion 56a, can cause the next-subsequent address of the control memory means 52 to be enabled, the period generator time interval set by the period generator field (bits b0–b15) can be utilized in two different manners. If one of the other portion means in digital interface subsystem 40 is normally expected to generate an EOP signal for the conditions established by a particular data word then enabled, then the additional EOMP signal provided by period generator portion 56a is redundant, but serves as a "watchdog" timer in the event that the other portion means fails to provide the expected EOP signal for any reason. Conversely, if no other portion means 40-2 through 40-5 is expected to generate an EOP signal for the conditions enabled by the present data word (a condition which obtains when, for example, no other portion means 40-2 through 40-5 is enabled by the data word then enabled in master sequencer portion means 40-1), then the EOMP signal determines how long the master sequencer portion means 40-1 stays at the present data word address and clocks out "dead" timing intervals when no gradient signal waveform is being generated. In addition, establishment of timing intervals by proper setting of the period generator field can be utilized to synchronize the activities of a plurality of the waveform-generator portion means 40-3 through 40-5.

For example, if one, or both, of the X-gradient field and/or Y-gradient field signal waveforms must commence after exactly one-half of the Z-gradient field signal waveform generated by one of the Z1 or Z2 waveform-generator means 40-4 or 40-5, the master sequencer portion means 40-1 may be programmed to commence the Z-gradient field signal waveform generation at a first address (A), responsive to a data word having a period generator field establishing the period generator portion 56a in a manner such that the EOMP signal is generated at the end of a time interval equal to one-half of the time interval required to generate the entire Z-gradient signal waveform. When this time interval elapses and the EOMP signal is generated, the master sequencer portion means increments the control memory means 52 to its next address. At this next-subsequent address (B), the 64-bit data word contained in control memory 52 contains EN, INT and sync. field subfield bits which enable both the XY waveform-generator portion means 40-3 and the Z1 waveform-generator portion means 40-4. Thus, the XY waveform-generator portion means will begin to generate the required X-gradient field and/or Y-gradient field signal waveforms, while the Z1 waveform-generator portion means will continue operating as if the transition to this next-subsequent data word had not occurred. If the period generator field for this next-subsequent data word (at address B) is set for the same time interval (i.e. one-half the total time interval required) as in the previous data word (at address A), then the X and/or Y and Z gradient fields all terminate at the same time and the X and/or Y gradient fields are present for only one-half the total time interval during which the Z gradient field is present, as initially required. Since all portion means 40-1 through 40-5 are clocked by the common master clock means 50, the synchronization of a plurality of portion means 40-1 through 40-5 is relatively accurate, having a maximum error of only several logic-gate delays (a maximum error time considerably less than the 100-nanosecond clock cycle time for a 10 MHz. CLK signal).

It should be understood that master sequencer portion means 40-1 may provide many other functions beyond the minimum above-described functions required by our high-field system. For example, master sequencer portion means 40-1 can provide an interrupt signal to computer means 30 upon termination of the presence of any, or all, data word in logic means 58 (i.e. upon the loading of a next-subsequent data word in logic means 58 from control memory 52). Thus, a preselected subfield (suh as the bit 19 subfield) of the EN,INT and jump field of any particular data word can be set to generate a CPU interrupt responsive to an EOP, EOMP or other condition for any data word at the termination of which the CPU must perform some operation (such as reloading a portion means register and the like), or when an abnormal condition occurs. Also, portion means 40-1 may contain logic means requiring the presence of at least one external gate signal before a sequence can proceed; this allows external gating to occur responsive to some trigger event, such as a signal zero-crossing, a cardiac signal peak, or the like event. Similarly, the status registers of portion 56b can be established to be read by the computer means CPU such that the computer means can ascertain which control memory data word address generated the interrupt and/or which of portion means 40-1 through 40-5 generated an EOP signal. Similarly, the start address register of portion 56b can be utilized as a start address/run register, determining not only the starting address within a page, but also determining the start and stop conditions of the master sequencer portion means. Further, the page register of portion 56b can be utilized as a page/clock register which is loaded, via data channel 30c, from the computer means CPU to select which of a plurality of CLK signal sources (the internal master clock means 50 or a selected one of at least one external clock signal sources) is to be utilized by the interface means, as well as which of the plurality, e.g. four, pages of control memory will be then utilized. It should also be understood that the master sequencer portion means 40-1 is illustrated, in FIG. 2d, in logical block diagram form, and that actual physical portions of means 40-1 (or of any of the other portion means of the interface means) can be physically present on a single printed circuit board or on several printed circuit boards, with or without portions of other portion means 40-2 through 40-5. In particular, because of the relative few integrated circuits required for the Z-gradient waveform generator portion means 40-4 and 40-5, and the relatively large number of integrated circuits required to implement master sequencer portion means 40-1, the bit b32–b63 portion of control memory means 52 and at least portions of the gate enable logic, DC register and DAC means have been physically integrated therewith in the actual physical system implementation of our presently preferred system embodiment.

Referring now to FIG. 2a, digitizer portion means 40-2 receives a pair of phase-quadrature I and Q video signals (from receiver means 26b) at digital interface subsystem input port 40c. The I signal appears at a first digitizer portion means input 40-2a, connected to the input 66a of a first sample-and-hold (S&H1) means 66, while the Q signal appears at a second digitizer portion means input 40-2b, connected to the input 68a of a second sample-and-hold (S&H2) means 68. Each of sample-and-hold means 66 and 68 will, responsive to a predetermined logic state at the associated sample input 66b or 68b, sample the present value of the analog I or Q signal and hold that value at an associated output 66c or 68c, respectively. The held sample I output 66c signal is coupled to the analog input 70a of a first analog-to-digital converter (ADC1) means 70, while the held sample Q output 68c signal is coupled to the analog input 72a of a second analog-to-digital converter (ADC2) means 72. Responsive to the proper state of a signal at the associated one of the conversion control inputs 70b or 72b, ADC1 means 70 or ADC2 means 72 provides a multiple-bit digital data word (corresponding to the magnitude of the respective input analog signal) at an associated output 70c or 72c, respectively. Each of means 70 and 72 is a high-speed 15-bit ADC which, after digitization, provides a data word which is sign-extended to a normal 16-bit two's-complement format. The I and Q channel video information is converted to interleaved digital data words, with the I channel word always "appearing" first, although both channels are sampled substantially simultaneously. The interleaved sample/conversion process of the two information channels is carried out responsive to the two logic states of the signal on wire 74. FIFO regiser means 76 will typically store a plurality P, e.g. P=2 in the illustrated embodiment, of sequential data words; thus, the digital data word does not appear at the register means output 76c, and is not coupled to the CPU data channel 30c, until P 16-bit data words are present in the register (i.e. after one pair of interleaved I and Q channel conversions have occurred).

Control submeans 80 includes not only a programmable clock period generator portion 80a, controlling the time interval between each analog-to-digital conversion, but also includes a starting address register portion 80b and a word count register portion 80c for determining, in conjunction with a word count zero detector means 82, the total number of interleaved conversions required and the completion of that required number of conversions. Since a pair of interleaved conversions occur for each cycle of the logic level waveform on line 74, itself provided as the output of programmable clock period generator portion 80a, the word count (WC) register portion 80c is directly loaded from CPU data channel 30c with the required number of words, prior to the enablement of digitizer portion means 40-2. The time interval between line 74 logic state changes is also loaded into programmable clock period generator portion 80a prior to portion means 40-2 enablement. The particular ADC means 70 and 72 utilized in our presently preferred system allow a maximum speed of about $2.5 \times 10^5$ pairs of interleaved data conversions for second or about 4 microseconds per data point, where each data point contains both an I-channel and a Q-channel data word.

In operation, the number of words of interleaved conversions is loaded into the WC register portion 80c and the clock period (a multiple of the minimum conversion time of 4 microseconds) is loaded into programmable clock period generator portion 80a. Thereafter, master sequencer portion means 40-1 generates a digitizer portion means 40-2 enable ADEN signal, which is carried by interface means bus portion 40-6c to generator means portion 80a. Responsive thereto, the clock period generator portion 80a begins to generate logic level changes on line 74. Responsive to the first positive-going logic level change on line 74, storage pulses are generated for that level change and for each level change thereafter, for introduction to storage control input 76b. The initial value $WC_i$ in register 80c is decremented by one for each complete cycle of the clock period generator portion 80a. When the required number of interleaved pairs of conversions have been completed, the value in WC register portion 80c falls to zero and this zero word count register value is detected by zero word count zero detector means 82, which issues a digitizer portion means interrupt (INTD) to data bus portion 40-6a. The INTD signal is transmitted to the interrupt and EOP logic portion 58b of master sequencer logic means 58 to indicate that digitization of the received NMR signal is complete. It should be understood that the use of FIFO register means 76 allows digitizer portion means 40-2 to be relatively permissive of contentions on data channel 30c with other apparatus of the direct-memory-access type, and conversion data will not be lost as long as the digitizer portion means 40-2 output can be given access to the CPU data channel 30c before register means 76 overflows. As each data word is accepted by the computer means CPU, an acceptance signal can be returned along data channel 30c to an error register means 84. An output present OR signal can be provided at register means output 76c, to error register 84, such that the ignoring of the initial invalid words can be indicated to the CPU. Conversely, acceptance by the CPU of each FIFO register means output word can be signaled. In the event that a valid FIFO register means output word is not accepted by the CPU, an overflow condition is declared by error register means 84 and is signaled back to computer means 30 via CPU data channel 30c. In addition, a second error signal, or bit, is defined by the presence of an overrange OR signal from either of the channel ADC means 70 or 72; the overrange error signal can be utilized to instruct the computer means to forego processing of any overrange (and therefore meaningless) data. In our presently preferred embodiment, only a word count zero will cause an interrupt (the INTD signal) to be generated, and analog-to-digital data conversion will continue in spite of either, or both, of the buffer overrun or conversion overrange errors, unless the system control program decides otherwise.

Referring now to FIGS. 2a and 2b, a schematic block diagram of the XY waveform-generator portion means 40-3 is shown. This portion means includes a period generator means 85 similar to the period generators in each of portion means 40-1, 40-2, 40-4 and 40-5. The clock period generator means 85 includes a frequency f selector means 85a which receives the clock CLK waveform from internal bus 40-6 and receives configuring information from the computer means CPU data channel 30c. Frequency selector means 85a generates a periodic divided frequency clock CLK' signal to a first input of a period generator circuit 85b. A second input of period generator circuit 85b receives a 12-bit digital data word establishing the time interval $\tau$ between successive period pulses provided at the pulse generator means output 85d. The 12-bit pulse time interval data word is provided at the output of a period "n·f" register 85c, receiving a 12-bit period-establishing data word from computer means CPU data channel 30c and also receiving a "load" pulse from interface means internal data bus 40-6. The 12-bit data word in period register 85c allows one of 4096 possible values to be chosen for each setting of frequency selector 85a. The frequency selector 85a is provided with three selection data bits, providing eight possible configurations for the CLK' output; the frequency selector is a six-decade frequency divider having a seventh "undivided" selectable output and an eighth "off" selectable output. Thus, the programmable range of period time interval spacings is as shown in the following table:

| PROGRAMMABLE PERIOD GENERATOR OUTPUT PULSE TIMING RANGES | | | |
|---|---|---|---|
| fDATA | DECADE | CLK' FREQ. f | n·f RANGE |
| 000 | 0 | OFF | — |
| 001 | 1 | 10 Hz. | 0.1–409.6 Sec. |
| 010 | 2 | 100 Hz. | 0.01–40.96 Sec. |
| 011 | 3 | 1 KHz. | 1.0 mSec.–4.096 Sec. |
| 100 | 4 | 10 KHz. | 100 $\mu$Sec.–409.6 mSec. |
| 101 | 5 | 100 KHz. | 10 $\mu$Sec.–40.96 mSec. |
| 110 | 6 | 1 MHz. | 1 $\mu$Sec.–4.096 mSec. |
| 111 | 7 | 10 MHz. | 0.1 $\mu$Sec.–409.6 $\mu$Sec. |

It will be understood that period generator means 85 can be realized with other forms of circuitry, and that whichever form of period generator means 85 is utilized can be equally as well utilized for the basic period generator portion 56a of means 56 (in the master sequencer portion means 40-1), as the basis for programmable clock period generator portion 80a of means 80 in the digitizer portion means 40-2, and in any other period generator utilization required in our system.

The periodic pulses at period generator means output 85d appear at a clock CLK' input 88a of an address memory means 88. Address memory means 88 includes a first, "start" address (SA) input 88b receiving a starting-address data word from a start address register 90, itself receiving the starting address data from computer means CPU data channel 30c; a second, enable EN input 88c of the address memory means receives an XY-enable (XYEN) signal on portion 40-6b of the internal data bus. Address memory means 88 also has a third, "end" input 88d receiving an end-count signal from a first output 92a of an end-of-period detector means 92. A first input 92b of the end-of-period detector means receives a 12-bit present-address (PRA) data word from a first output 88e of address memory means 88. The 12-bit data word corresponding to the present address appears at the data output 88f of address memory means 88. End-of-period detector means 92 also receives an end-address data word at another input 92c, from an end address register means 94, itself receiving the 12-bit end address data from computer means CPU data channel 30c. A third input 92d of the end-of-period detector means receives a continuous-run XYCR signal, via the internal data bus line 40-6b, from logic means interface enable logic portion 58c and provides a second output 92e on which an XY waveform-generator portion means end-of-period (EOPXY) signal is provided to the internal data bus interrupt portion 40-6a for return to the master sequencer logic means interrupt & EOP logic portion 58b.

The 12-bit address word at memory means output 88f is provided to the address input 96a and 97a, respectively, of an X-gradient $G_x$ random access memory (RAM) means 96 and a Y-gradient $G_y$ RAM memory means 97, respectively. Data can be loaded into RAM memory means 96 and 97 via the CPU data channel 30c connection to the RAM means data and control inputs ports 96b and 97b, respectively. Output data appears at a portion 96b' or 97b' of the respective RAM means data ports 96b or 97b, respectively. The 12-bit output data words appearing at these ports are respectively provided to the Gx input 98a or the Gy input 98b of a multiplier-adder means 98. Means 98 also has a pair of inputs 98c and 98d for respectively providing multiplier coefficient Kx and Ky data, respectively, from a Kx coefficient register means 100 or a Ky coefficient register means 101. The coefficient data is provided directly to the appropriate one of register means 100 or 101 from computer means CPU data channel 30c. Means 98 first (or "X") output 98e provides a 12-bit data word, corresponding to the product of the X-gradient $G_x$ term and the X-gradient coefficient $K_x$ term, to the input of an X-gradient $G_x$ digital-to-analog converter DAC means 102, while a second (or "Y") output 98f provides a 12-bit data word, which is the product of the Y-gradient $G_y$ data and the Y-gradient coefficient $K_y$ data, to the input of a Y-gradient $G_y$ DAC means 103. The respective X-gradient $G'_x$ signal and Y-gradient $G'_y$ signal are provided at the first waveform-generator portion means outputs 40-3a and 40-3b, respectively, as audio-frequency analog signals having a maximum ±10-volt amplitude; these signals are coupled to gradient drive switching means 48.

In operation, the XY waveform-generator portion means 40-3 has two basic operating modes: the "load" mode and the "run" mode. In the "load" mode, gradient waveforms are not being generated and all of the computer means-accessible registers and memories (e.g. registers and/or memories 85a, 85c, 90, 94, 96, 97, 100 and/or 101) can have data read therefrom or written thereto by the computer means central processing unit, via data channel 30c. The "load" mode corresponds to the "XY enable" signal XYEN being in a logic 0 condition. When XYEN is in a logic 1 condition, the XY waveform-generator portion means 40-3 is in the "run" mode. Assuming that the appropriate frequency f, period n·f, start address SA and end address EA information has been previously loaded into respective frequency selector register means 85a, period register means 85c, start address SA register means 90 and end address register means 94a, that the necessary $G_x$ and $G_y$ data has been loaded into memory means 96 and 97, respectively, and the required $K_x$ and $K_y$ coefficient information has been entered into registers 100 and 101, then the appearance of a logic 1 XYEN signal causes the following operations to occur: the start address SA data is loaded into address memory means 88; the end address data is loaded into end-of-period detector means 92; and period generator means 85 begins to produce CLK' pulses each occurring $\tau$ seconds apart. Each of the start and end addresses represents one of the 2048 possible addresses in address memory means 88. Responsive to the XYEN signal, the first, starting address SA is provided at memory means output 88f, to the RAM means 96 and 97. The data previously stored therein at the first address is made available to the $G_x$ and $G_y$ inputs 98a and 98b, respectively, of means 98, and is individually multiplied by the appropriate $K_x$ or $K_y$ coefficient from the associated one of registers 100 or 101. The resulting gradient data is transformed into an analog level by the associated one of DAC means 102 or 103 and appears at the associated one of outputs 40-3a or 40-3b. Responsive to the first pulse from period generator means output 85d, the address of memory means 88 is advanced to the next address stored therein. This new present address PRA data word is checked by the end-of-period detector means 92 against the end address data word stored in register means 94. If the present address of address memory means 88 does not match the end address of register 94, the end-of-period detector means 92 does not send an "end" signal to memory means input 88d. The new address data is provided to memory means 96 and 97 and the associated waveform data at the second requested address in each RAM means is sent to the multiplier means 98, with the new scaled waveform data being converted into the associated analog levels for appearance at the portion means outputs. The address memory means continues to provide new addresses, sweeping out the range from the start address, contained in register 90, to the end address, contained in register 94, to determine the X and Y gradient output signal waveforms. If the stop address is numerically less than the start address, the address memory means will increment from the start address until the highest address in memory means 88 is reached and will then "wrap around" to address zero and continue to increment the address memory means address data until the "end address" is reached. The "wrapping around" facility does not affect any end-of-period condition for the XY portion means 40-3. The actual end-of-period EOPXY signal will be sent from means 92 only when the present-address PRA data received from address memory means output 88e is equal to the end address data received at input 92c from register means 94. The time that is required to transverse the range of addresses from the start address to the end address is the product of the address range to be stepped through and the time interval $\tau$ between successive-address-enabling pulses from period generator means output 85d. Unless the continuous run XYCR signal is at a high logic level, each time the address memory means has advanced to the end address the end-of-period detector means 92 sends the EOPXY signal to the master sequencer portion means 40-1, and address memory means 88 is reloaded, by the appearance of an "end" signal at input 88d (from end-of-period detector means output 92a) to the start address presently contained in register means 90. Thereafter, the master sequencer portion means control memory 52 determines subsequent activity of the XY waveform-generator portion means 40-3. That is, the master sequencer control memory reacts to the EOPXY signal (or, alternatively, to any other EOP signal) by incrementing to its next control memory address. At this next control memory address, the contents of the 64-bit control memory data word will determine, for example, whether the XY waveform-generator portion means is again to receive an XYEN enabling signal to cause this portion means to once more begin to sweep out the memory addresses (and therefore the gradient signal waveforms) presently contained therein. If the XY waveform-generator portion means is not enabled, all activity in portion means 40-3 ceases until the master sequencer portion means once again sends the enabling XYEN signal.

If, however, the present master sequencer control word is such that the XY waveform-generator portion means continuous-run XYCR signal is present at detector means input 92d, then the end-of-period detector means 92 is inhibited from sending the EOPXY end-of-period signal when the ending address is present in address memory means 88. However, the auto-reload of the start address SA data from register means 90 into address memory means input 88b will still occur and therefore the XY waveform-generator portion means will continuously sweep out the address range from the previously-loaded "start address" to the previously-loaded "end address", until the XYEN enabling signal falls to a low logic level for any reason.

While the address memory means output 88f data word sweeps from the starting address to the ending address, as controlled by enabling continuous-run signal, the associated addresses in the $G_x$ and $G_y$ RAMs means 96 and 97 are cyclically swept out. This provides a changing sequence of 12-bit data words to the $G_x$ and $G_y$ inputs of multiplier means 98. Each of the $G_x$ and $G_y$ actual data words are multiplied by the appropriate $K_x$ or $K_y$, respectively, coefficients from register means 100 or 101 to provide the digital data inputs for the X and Y gradient DAC means 102 and 103 and provide, responsive thereto, the analog audio-frequency gradient signals at outputs 40-3a and 40-3b.

Referring now to FIGS. 2c-1 and 2c-2, a pair of second-type waveform-generator portion means 40-4 and 40-5 are seen to contain essentially all of the same means as contained in the first-type waveform-generator portion means 40-3. As with portion means 40-3, portion means 40-4 and 40-5 each generate a pair of audio-frequency analog signal waveforms. Two different Z-gradient waveforms are often required for a single NMR imaging or spectroscopy sequence, as are two different RF pulse-shape modulation functions. As will be seen in subsequent discussion, hereinbelow, of some of the presently preferred imaging/spectroscopy sequences, the X-gradient and Y-gradient signals generally require only a single signal, of the same waveshape, amplitude and time duration, in each repetition of a particular imaging sequence, whereby any X-gradient or Y-gradient signal waveform changes can be commanded from the computer means CPU data channel 30c, in a relatively short time after the EOP of a first sequence and immediately prior to the start of a second sequence. Conversely, the Z-gradient waveform typically requires two different amplitude/time duration waveforms (even if of the same waveshape during any one particular sequence) while the RF pulse-shaping modulation (PS) gate function is often required to generate a pair of waveforms having entirely different durations, waveforms and/or amplitudes, as, for example, in any single sequence requiring a selective 90° RF pulse, typically provided with a frequency-limiting modulation envelope (such as a Gaussian, sinc or other non-rectangular waveform) and also requiring a non-selective 180° RF pulse, having a rectangular PS modulation envelope and an entirely different amplitude and duration than the selective 90° non-rectangular RF pulse. For these reasons, two Z-gradient signal waveforms $G'_{Z1}$ and $G'_{Z2}$ are to be generated, in addition to first and second RF carrier pulse-shaping PS1 and PS2 modulation envelopes. It is somewhat arbitrary as to which of the two second-type waveform-generator portion means 40-4 and 40-5 generate which pair of the four signals; however, since only one pulse-shaping PS waveform signal is generally required at the same time as a Z-gradient signal waveform, it is advantageous to have one of the portion means, e.g. portion means 40-4, generate a first Z-gradient waveform and a first pulse-shaping signal waveform, while the other portion means, e.g. portion means 40-5, also generates a single Z-gradient signal waveform and a single pulse-shaping PS signal waveform. Since the Z-gradient and pulse-shaping waveforms are often enabled and disabled in sets, the above partitioning allows one of portion means 40-4 or 40-5 to be enabled at any one time, while the other portion means 40-5 or 40-4 is simultaneously disabled and being downloaded with new data from data channel 30c, for subsequent enablement at a future time (when the other one of the portion means is disabled and being newly downloaded with data for a next subsequent usage). In this manner, the varying Z-gradient and/or pulse-shaping functions can be rapidly modified during any particular NMR investigation sequence.

Each of portion means 40-4 and 40-5 has the period generator, address memory, start address register, EOP detect, end register, RAM, constant registers, multiplier-adder and analog-to-digital conversion means shown, and numbered with reference designations similar to those of portion means 40-3 (where means 40-4 has single-prime reference designations in FIG. 2c-1 and portion means 40-5 has double-prime reference designations in FIG. 2c-2). The sequence of operation, responsive to the CLK signal to generate individually programmable memory-updating time interval signals $\tau_1$ or $\tau_2$, and with enablement responsive respectively to the Z1EN or Z2EN signals, with continuous-run capability responsive to the appropriate one of the Z1CR or the Z1CR signals, and generation of end-of-period signals EOPZ1 or EOPZ2, respectively, will be understood by referring to the discussion of operation of portion means 40-3 hereinabove. The respective first and second gradient "axis" signals $G'_{Z1}$ or $G'_{Z2}$, or the first and second pulse-shaping signals PS1 or PS2 can be switched responsive to computer means CPU signals and/or switching signals provided on the interface means internal data bus 40-6 from master sequencer portion 40-1. Only one axis-gradient $G'_Z$ signal and only one pulse-shaping PS gate signal are provided by the pair of portion means 40-4 and 40-5 at any particular instant.

EXEMPLARY IMAGING AND SPECTROSCOPY METHODS FOR HIGH-FIELD NMR SYSTEM WITH DIGITAL INTERFACE SUBSYSTEM

Referring now to FIGS. 3–7, several exemplary methods will be described for NMR imaging or NMR chemical-shift spectroscopy with a high-field system utilizing our novel digital interface subsystem. The gradient switching means has been previously programmed to select which one of field signal $G_{X'}$, $G_{Y'}$ and $G_{Z'}$ is to be provided as the associated one of the $G_X$, $G_Y$ or $G_Z$ signals; thereafter, digital subsystem 40 controls signal waveshapes and timing/gating. It should be understood that these methods, and the particular magnetic gradient field signals, RF magnetic field signals (and gating/modulation waveforms therefor) and the like signals are presented by way of example only and are neither intended to limit the methods and/or signal waveforms utilized, nor limit the digital interface subsystem to apparatus capable of performing only the illustrative method(s).

Referring first to FIG. 3, the field gradient ($G_z$, $G_x$ and $G_y$), pulse-shaping (PS) and gating (CHA, CHB, RFC, ARB, PAB and ADEN) signals for a partial-saturation two-dimensional (2D) spin-warp imaging sequence are illustrated. While several aspects of the imaging method utilizing this sequence of signals are more fully described and claimed in U.S. Pat. No. 4,443,760, issued Apr. 17, 1984, assigned to the assignee of the present application and incorporated herein by reference in its entirety, the method may briefly be described as follows: prior to the beginning of each imaging sequence (commencing at time $t_0$), all of the gradient $G_z$, $G_x$ and $G_y$ waveforms, as well as the pulse-shaping PS waveform and the gate signal waveforms CHA, CHB, RFC, ARB, PAB and ADEN, are at an essentially zero magnitude level, as shown by waveform portions 250a–259a, respectively. At first sequence commencement time $t_0$, the gradient field signal in the direction of the axis along which the constant sample slice thickness is to be provided, e.g. the $G_z$ signal for an axial slice with constant thickness in the Z-direction, is pulsed to a positive polarity level, as shown by waveform (a) portion 250b. In the presence of the gradient pulse 250b, a 90° RF selective excitation pulse is provided by enabling the transmitter means I-channel with the CHA waveform portion 254b of waveform (e), the RF combiner RFC enabling waveform portion 256b of waveform (g), the RF power amplifier means ARB enabling signal portion 257b of waveform (h), the preamplifier blanking PAB signal portion 258b of waveform (i) and a non-zero pulse-shaping signal level in the I-channel, such as the waveform (d) signal portion 253I (having a sinc bt modulation envelope), which is also present, as required, in the Q-channel. The pulse-shaping I-channel modulation envelope portion 253I commences at a time $t_1$ after the sequence commencement time $t_0$ and terminates at a time $t_3$ prior to the $G_z$ gradient pulse termination time $t_4$, with the pulse-shaping waveform reaching a peak at a time $t_2$ substantially midway between time $t_1$ and $t_3$. The combination of the selective excitation 90° RF pulse of narrow bandwidth and in the presence of a positive $G_z$ field gradient excites the desired thin slice of spins perpendicular to the Z-axis. The slice thickness is dependent upon the amplitude of $G_z$ signal portion 250b and the duration ($t_3-t_1$) of the 90° pulse. Sample plane excitation is followed by an information-encoding interval (commencing at time $t_4$ and terminating at time $t_5$) during which the $G_z$ signal is provided as a negative-polarity gradient, as in portion 250c, along with a positive $G_x$ field gradient signal portion 251b and a Y-direction phase-encoding field gradient pulse portion 252b of waveform (c). The $G_z$ portion 250c has a magnitude established in accordance with the equation $$\frac{1}{2}\int_{t_1}^{t_3} G_z(t)dt = \int_{t_3}^{t_5} G_z(t)dt,$$

to facilitate rephasing of the excited nuclei spins. The waveform (b) positive $G_x$ portion 251b acts as an excited nuclei dephasing pulse while the phase-encoding $G_y$ pulse 252b is provided with a magnitude selected to encode spatial information in the Y-direction. The pulse-shaping PS signal and all of the six gate signals are at a substantially zero magnitude during the appearance of the three gradient pulses. Upon termination of the three-gradient-pulse period (at time $t_5$) a short time interval (until time $t_6$) is provided for the gradient signals (primarily the $G_z$ signal) to return to the substantially zero level, e.g. the final $G_z$ field gradient level 250a'. At time $t_6$ a non-selective 180° RF pulse is applied by providing enabling a waveform (f) signal portion 255b and signal portions 256c, 257c and 258c in the respective CHB, RFC, ARB, and PAB gate signals and by the appearance of a substantially-rectangular Q-channel pulse-shaped modulation signal 253Q; the 180° non-selective RF pulse, applied in the absence of any imaging gradients $G_n$ (where n=x, y or z) serves to rephase the nuclei spins dephased by inhomogeneities inherent in the main magnetic field. The 180° RF pulse signal portions 253Q, 255b, 256c, 257c and 258c are all applied such that the pulse is substantially symmetrical about mid-time $t_7$, which is established to occur after a time interval T from the time $t_2$ at which the 90° RF selective pulse peak occurs. Responsive thereto, the stimulated nuclei generate an NMR echo signal having a maximum amplitude occurring at a time 2T after the midpoint of the 90° RF selective pulse, or after a time interval T after the non-selective pulse midtime $t_7$. Prior to the occurrence of the echo peak, an X-direction gradient field $G_x$ portion 251c is enabled (commencing at time $t_9$) and shortly thereafter (at time $t_a$) the analog-to-digital digitization of the received signal is begun by the presence of a non-zero ADEN enabling portion 259b of waveform (j). The spin-echo signal peak occurs at the somewhat later time $t_b$, and the spin-echo response signal diminishes to a substantially zero magnitude by a time $t_c$ at which the ADEN digitizing enablement signal returns to the disabling final level 259a'. Shortly thereafter, at time $t_b$, the $G_x$ field gradient level falls to the substantially zero final level of portion 251a'. It should be understood that the amplitude of the $G_x$ dephasing pulse portion 251b is adjusted to ensure that the spin-echo maxima occurs at the same time interval T after the middle of the non-selective pulse, as the time interval T between the midpoints of the selective and non-selective RF pulses, and the "steady" $G_x$ level of portion 251c is selected to maintain the phase during the spin-echo signal presence. The sequence ends with the large field gradient pulse 252c in either the Y-direction $G_y$ signal, as shown, or in the Z-direction $G_z$ signal; these pulses 252c are "spoiler" pulses serving to destroy the phase coherence of the transverse magnetization and prepare the sample for the next application of the imaging sequence. It will be seen that all of the three field gradient signals of waveforms (a), (b) and (c) have returned to their initial, substantially zero values, in portions 250a', 251a' and 252a', respectively, and that the modulation and gate signals of waveforms (d)-(j) have returned to their substantially zero levels in portions 253a'-259a', at the end of the sequence and are thus at the proper levels for the commencement of the next subsequent partial-saturation two-dimensional spin-warp imaging sequence. Thus, after the "spoiler" pulse ends at time $t_f$, a next sequence of signals 250-259 commences, with a different $G_y$ phase-encoding gradient pulse amplitude, e.g. such as different amplitudes 252b-1 through 252b-3 (shown in broken line), and associated subsequent spoiler pulses, e.g. such as spoiler pulses 252c-1 through 252c-3 (also shown in broken line), each of which may, but need not, have the same magnitude as the peak magnitude of the phase-encoding gradient pulse 252b-1 through 252b-3, associated therewith, and with the phase of the selective 90° pulses being alternated, as shown by the negative-polarity peak sinc bt pulse-shaping modulation waveform 253I' (shown in broken line). A total of $N_y$ different values of the $G_y$ phase-encoding gradient pulse portion 252b is utilized to provide $N_y$ sequential spin-echo reception signals, each of which is complex Fourier transformed, with respect to time, to yield a different one of $N_y$ projections. A second Fourier transform is then performed with respect to $G_y$ amplitude to generate the two-dimensional NMR image. The repetition period between applications of the illustrated sequence, i.e. the time between the commencement time $t_0$ of a first imaging sequence and a time $t_0'$ of the next subsequent imaging sequence, is adjusted to optimize the contrast for images of the spin-lattice relaxation time constant $T_1$, coordinately with optimization of the signal-to-noise ratio of the image.

The resulting image typically contains an array of 256×256 pixels (representing an area of between about 5 and about 75 cm. on each side) with a typical thickness of between about 0.5 mm. to about 15 mm.

Figure 4:
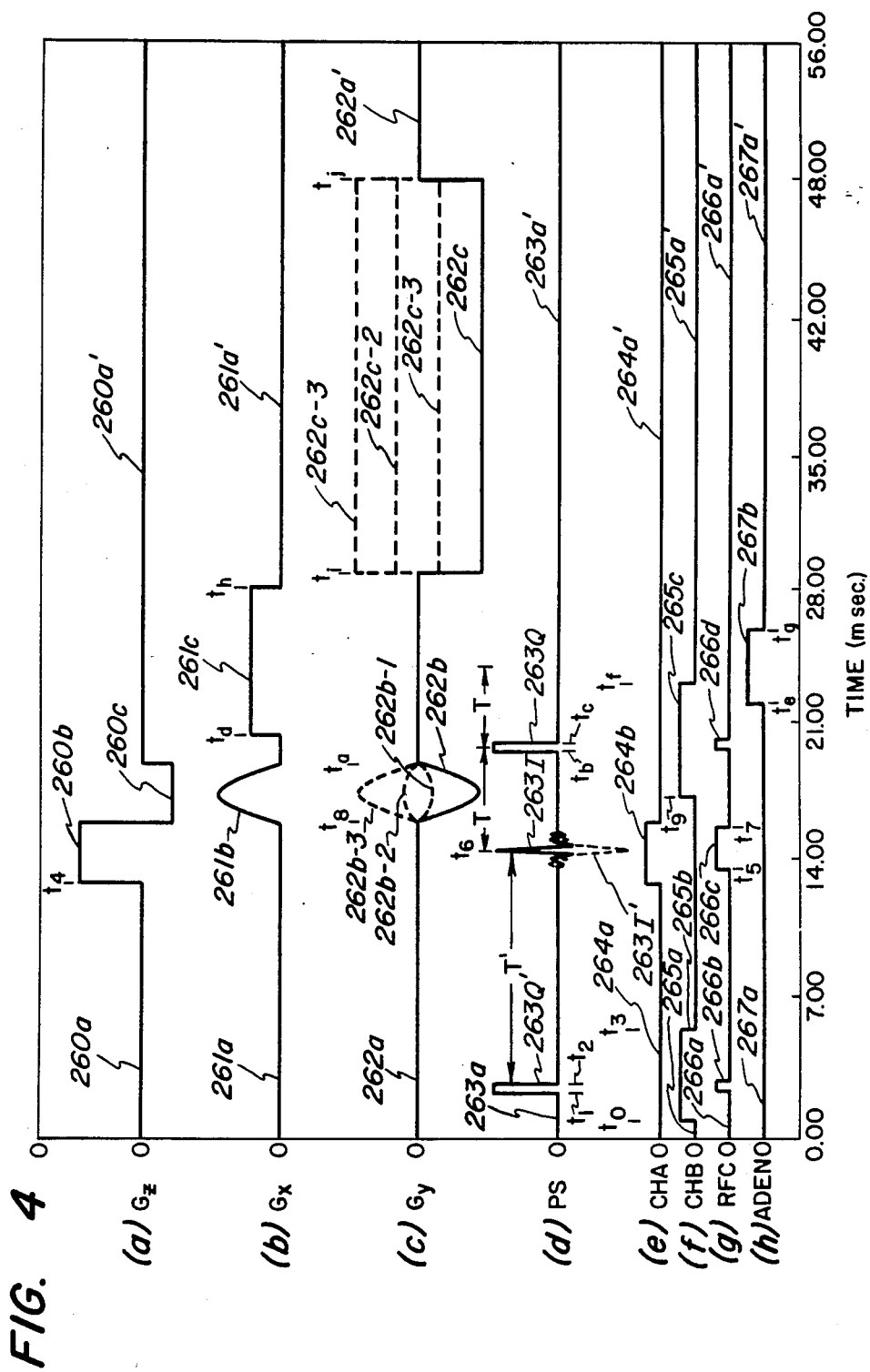

Referring now to FIG. 4, the signals for a two-dimensional inversion-recovery spin-warp imaging sequence are illustrated. The inversion-recovery sequence is substantially the same as the sequence of FIG. 3, with the exception that an additional 180° non-selective RF pulse 263Q' is applied at a time T' prior to the time $t_6$ at which the peak of the 90° selective RF pulse 263I occurs. During the time interval T', excited nuclear spins throughout the sample recover their Z-direction magnetization at a rate dependent upon the spin-lattice time constant $T_1$ of the particular nuclear spin; spin-lattice relaxation time constant $T_1$ images can be constructed by varying the time interval T' in subsequent scan sequence experiments. It will be seen that the waveforms of FIG. 4 do not show the ARB waveform, which is (as shown in FIG. 3) essentially identical to the RFC waveform in commencement, termination and magnitude of the enabling and disabling levels; it will be further seen that the preamplifier-blanking PAB signal also need not be specifically shown, as the PAB signal is the logic inverse of the RFC/ARB signal. It will be seen that the 13 individual time intervals required for the partial-saturation 2D spin-warp imaging sequence of FIG. 3 (requiring 13 interrupt-driven subsequence instruction sets to be loaded from the computer means 30) become 19 different time intervals, each requiring a separate set of instructions loaded into the digital interface subsystem by the computer mans of the high-field NMR imaging system. Specifically, prior to the beginning of each imaging sequence (commencing at time $t_0$), all of the gradient $G_z$, $G_x$ and $G_y$ waveforms, as well as the pulse-shaping PS waveform and the gate signal waveforms CHA, CHB, RFC and ADEN, are at an essentially zero magnitude level, as shown by waveform portions 260a-267a, respectively. At a first sequence commencement time $t_0$, the second transmitter channel CHB signal waveform is provided at the enabling high logic level, as shown by portion 265b of waveform (f). The first RF channel CHA signal waveform remains at the disabling, low logic level, as shown by waveform portion 264a, while the pulse envelope PS signal waveform portion 263a, the combiner gating RFC waveform signal portion 266a and the gradient field signal portions 260a-262a all remain at the low logic level; the analog-to-digital conversion signal portion 267a also remains at the disabling level. These various waveforms are shown in waveforms (a)-(e), (g) and (h) of FIG. 4. At some later time $t_1$, the RF combiner gate RFC signal is enabled to a high logic level, as in portion 266b, while the pulse-shaping PS signal portion 263Q' is brought to a level to initiate a non-selective 180° RF excitation pulse. This 180° RF pulse ends at time $t_2$, at which time the RFC pulse 266b also terminates. Thereafter, at a time $t_3$, the CHB signal returns to a low logic level and the transmitter is temporarily disabled. At a later time $t_4$, the Z-axis gradient $G_z$ signal is pulsed to a positive polarity level, as shown by waveform (a) portion 260b; slightly thereafter, the first transmitter channel CHA enabling level portion 264b, of waveform (e), commences. Shortly thereafter, at a time $t_5$, the combiner RFC signal portion 266c commences, as does the pulse-shaping modulation waveform portion 263I of waveform (d); responsive to the presence of the gradient pulse 260b along with a 90° RF selective excitation pulse (illustratively of the sinc bt modulation envelope type), the desired thin slice of nuclear spins, perpendicular to the Z axis, is excited in the sample. As before, the slice thickness is dependent upon the amplitude of $G_z$ signal portion 260b and the duration ($t_7-t_5$) of the 90° pulse. The 90° RF pulse occurs with its peak time $t_6$ being a predetermined time interval T' from the commencement at time $t_1$ of the first 180° non-selective RF pulse (of portion 263Q') of the waveform (d) signal. Thus, after the nuclear spins in the selected sample slice have been first inverted, the recovering inverted spins are now subjected to a 90° rotation into the XY plane. This rotation into the plane of the receiving coil essentially ends at time $t_7$, when the PS signal portion 263I and the RFC portion 266c terminate. Slightly thereafter, at time $t_8$, the rephasing $G_z$ lobe 260c commences, along with the commencement of the $G_x$ signal portion 261b and the $G_y$ signal portion 262b; all of the gradient signals end at a later time $t_a$. At time $t_9$, substantially occurring at the peaks of the $G_x$ portion 261b and $G_y$ portion 262b signals, the quadrature channel CHB signal rises to an enabling level in portion 265c. Therefore, at a time $t_b$ after the gradient signals have returned to their zero-magnitude levels, the pulse-shaped PS signal portion 263Q and the RFC signal portion 266d occur to provide a second non-selective 180° RF excitation pulse. This pulse terminates at a time $t_c$ such that the time interval T between the peak of the 90° selective and 180° non-selective RF pulses 263I and 263Q provides for a spin-echo at a like time interval T after the last 180° RF pulse. Prior to the occurrence of the spin-echo peak, an X-direction gradient field $G_x$ portion 261c is enabled (commencing at time $t_d$) and shortly thereafter (at time $t_e$), the analog-to-digital conversion process commences, responsive to the enabling high logic level portion 267b of the ADEN signal. The digitization of the received signal terminates at time $t_g$, with the X-axis gradient signal portion 261c being terminated at a time $t_h$ thereafter; a spoiler pulse portion 262c, in the Y-axis gradient $G_y$ signal, is generated in the time interval between time $t_i$ and time $t_j$ to destroy the transverse magnetization phase coherence and to prepare the sample for the next imaging sequence, occurring at a time $t_0'$ after the last time $t_j$ of the previous sequence. As in the partial-saturation technique described with respect to FIG. 3, the inversion-recovery technique of FIG. 4 utilizes a total of $N_y$ different values of both the $G_y$ phase-encoding gradient pulse portions 262b and 262b-1 through 262-3, and the identical associated amplitude levels of spoiler portions 262c and 262c-1 through 262c-3 (both shown in broken line), to provide $N_y$ sequential spin-echo reception signals, each of which is complex Fourier transformed, with respect to time, to yield a different one of $N_y$ projections. Again, a second Fourier transform is performed with respect to the $G_y$ amplitude to generate the two-dimensional NMR image. Since the nuclei in the excited sample recover their Z-direction magnetization at a rate dependent upon the different values of spin-lattice time constant $T_1$ thereof, during the time interval T', spin-lattice $T_1$ images are constructed by varying the time interval T' in subsequent scans.

Figure 5:
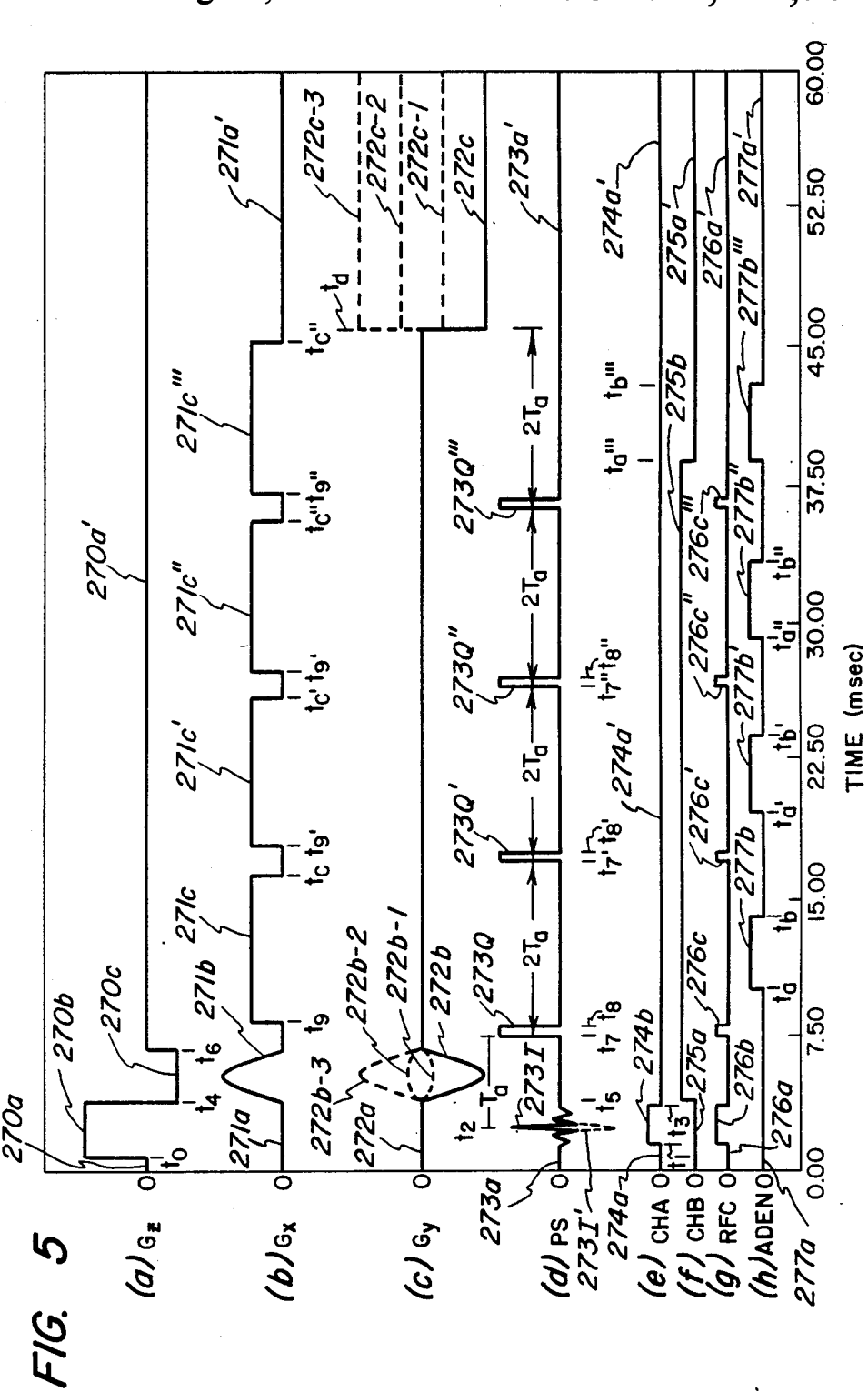

Referring now to FIG. 5, a multiple-echo 2D spin-warp imaging sequence is illustrated. The multiple-spin-echo sequence utilizes a single 90° selective RF excitation pulse, responsive to the PS signal waveform portion 273I, but utilizes a plurality of subsequent 180° non-selective RF excitation pulses 273Q, 273Q', 273Q", 273Q''', . . . , each occurring with a time interval $2T_a$ therebetween, where $T_a$ is the time interval between the peak of the 90° selective RF pulse modulation waveform (itself occurring at time $t_2$) and the commencement time of the first 180° non-selective RF excitation pulse 273Q. It will be seen that, during each sequence, a plurality of X-axis gradient field $G_x$ signal portions are repeatedly provided at the same level, as in waveform portions 271c, 271c', 271c", 271c''', . . . , with each portion occurring immediately after the associated one of the 180° non-selective RF pulses 273Q. Similarly, each of a plurality of analog-to-digital conversions is enabled for the associated spin-echo time interval, as shown by the ADEN signal portions 277b, 277b', 277b", 277b''', . . . in each sequence. Thus, in the illustrated first multiple-spin-echo sequence, a total of four echoes are received and processed; the data from these multiple echoes can be averaged to increase the signal-to-noise ratio of the received information. In a next-subsequent sequence, the Y-axis $G_y$ gradient signal phase-encoding portions 272b-1 through 272b-3 are varied to other ones of the $N_y$ different levels required for formation of the complete image; the same amplitude is also utilized for each subsequent value of one of the spoiler pulses 272c-1 through 272c-3, to prepare for still further sequences. The total of $N_y$ (where $N_y=128$ or $N_y=256$ in typical image production) sequences are each complex Fourier transformed in time and the set of $N_y$ projections are again Fourier transformed with respect to $G_y$ signal amplitude to generate the two-dimensional NMR image. Additionally, a separate image can be constructed from all of the like-numbered echoes, e.g. from the first echo of each of the $N_y$ sequences, from the second echo, ...; the decay in image data, with respect to time, can be plotted along the horizontal axis and utilized to compute a transverse relaxation time constant $T_2$ image. It should be understood that this multiple-spin-echo sequence can be combined with an inversion recovery technique by preceding the 90° selective RF excitation pulse (generated in the interval between time $t_1$ and time $t_3$) with a 180° non-selective RF excitation pulse, in the same manner as the initial 180° pulse of the sequence of FIG. 4 preceded the 90° initial pulse of the sequence of FIG. 3.

Figure 6:
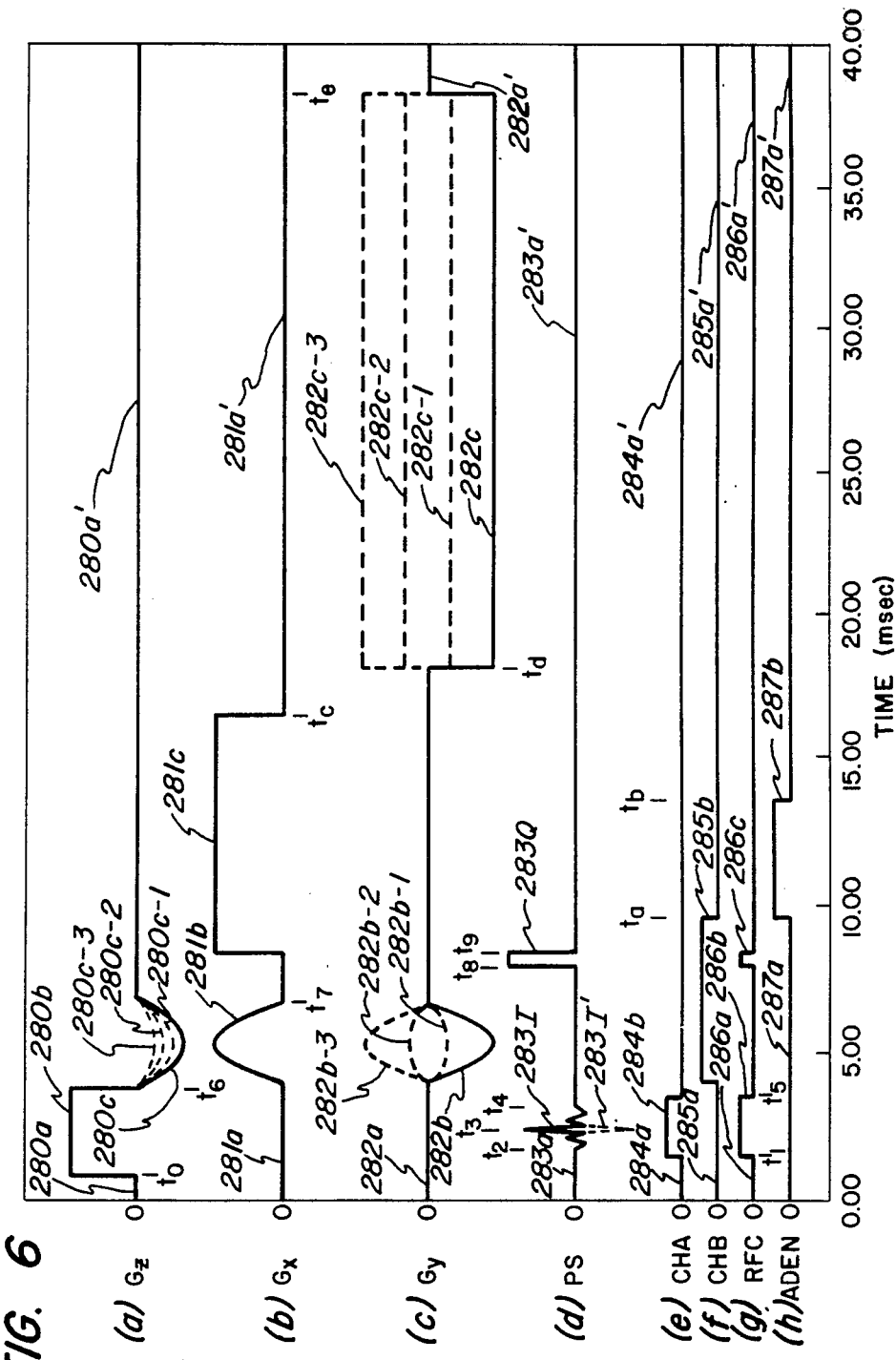

Referring now to FIG. 6, the signals for a restricted three-dimensional (3D) spin-warp imaging sequence are illustrated. It will be seen that this 3D sequence is similar to the 2D sequence of FIG. 3, with the exception of the $G_Z$ gradient signal rephasing lobe 280c. The Z-axis gradient $G_Z$ signal rephasing lobe portion 280c is a combination of the rectangular rephasing lobe waveform and an additional $G_z$ phase-encoding gradient waveform, to provide the illustrated lobular signal waveform shape; this lobe is present during the time interval from time $t_6$ to time $t_7$ and is concurrent with both the $G_X$ gradient signal lobe 281b and one of the $N_y$ different amplitudes of the $G_y$ gradient signal lobes 282b, 282b-1, 282b-2, 282b-3, ..., etc. The peak amplitude of gradient signal rephasing lobe portion 280c is (as shown by the various amplitudes of signal lobe portions 280c, 280c-1, 280c-2, 280c-3, ...) varied to each of $N_z$ different peak values to obtain $N_z$ different projections. Each of the $N_z$ different $G_z$ gradient signal rephasing lobe amplitude values is utilized with a full range of the $N_y$ peak values for the $G_y$ gradient signal lobes 282b through 282b-3 (and the associated "spoiler" pulse amplitudes 282c through 282c-3). At least $N_y \cdot N_z$ independent projections, utilizing $N_y \cdot N_z$ permutations of the $G_y$ and $G_z$ phase-encoding gradient signals must be collected to reconstruct a three-dimensional image by the 3D Fourier transform (3DFT) method; the data is transformed with respect to: time, $G_y$ amplitude and $G_z$ amplitude. It should be understood that all $N_y$ values of the $G_y$ gradient signal lobes may be sequentially provided for each $G_z$ gradient signal lobe value, or that each of the $N_z$ values of $G_z$ phase-encoding gradient signal lobe 280c may be provided sequentially for each value of the $G_y$ gradient signal phase-encoding lobe 282b, or that any other sequence of the $N_y$ phase-encoding $G_y$ gradient signal lobes and $N_z$ phase-encoding $G_z$ gradient signal lobes can be utilized, as long as the computer means 30 has been previously programmed to assign the acquired image data for any particular combination of $G_z$ and $G_y$ signal amplitudes to the appropriate cell of the total data matrix. After collection of at least the $N_y \cdot N_z$ independent projections, the data array (having a like number of $N_y \cdot N_z$ cells) is filled and the 3DFT processing (with respect to time, $G_y$ amplitude and $G_z$ amplitude) is carried out to provide a set of imaging data which can be displayed as a sequence of images with either the Y-axis or Z-axis value varying across the range for which data was taken. It should be understood that the initial 90° selective RF pulse, provided during the time interval between time $t_2$ and time $t_4$ of each of the $N_y \cdot N_z$ sequences, may be so established as to selectively excite all of the nuclei in a relatively thick slab (in the Z direction) of the sample to be imaged, and can be further established to define the number $N_z$ of Z-axis slices to be much less than the number $N_y$ of the Y-axis-parallel columns in each of the $N_z$ planes. It should be further understood that the restricted three-dimensional imaging sequence can be combined with inversion recovery techniques, such as that previously shown in FIG. 4, or with multiple-echo techniques, such as that previously shown in FIG. 5, by the addition of 180° non-selective RF pulses either before or after the 90° selective excitation pulse 283I or 283I' in each sequence, or with the addition of 180° non-selective RF pulses occurring both before and after the 90° selective RF pulse of each sequence. In this manner, a restricted three-dimensional set of images can be obtained with proton distribution, $T_1$-weighted, $T_2$-weighted and the like information, and can be so obtained either with or without signal averaging as provided by multiple-echo techniques.

Figure 7:
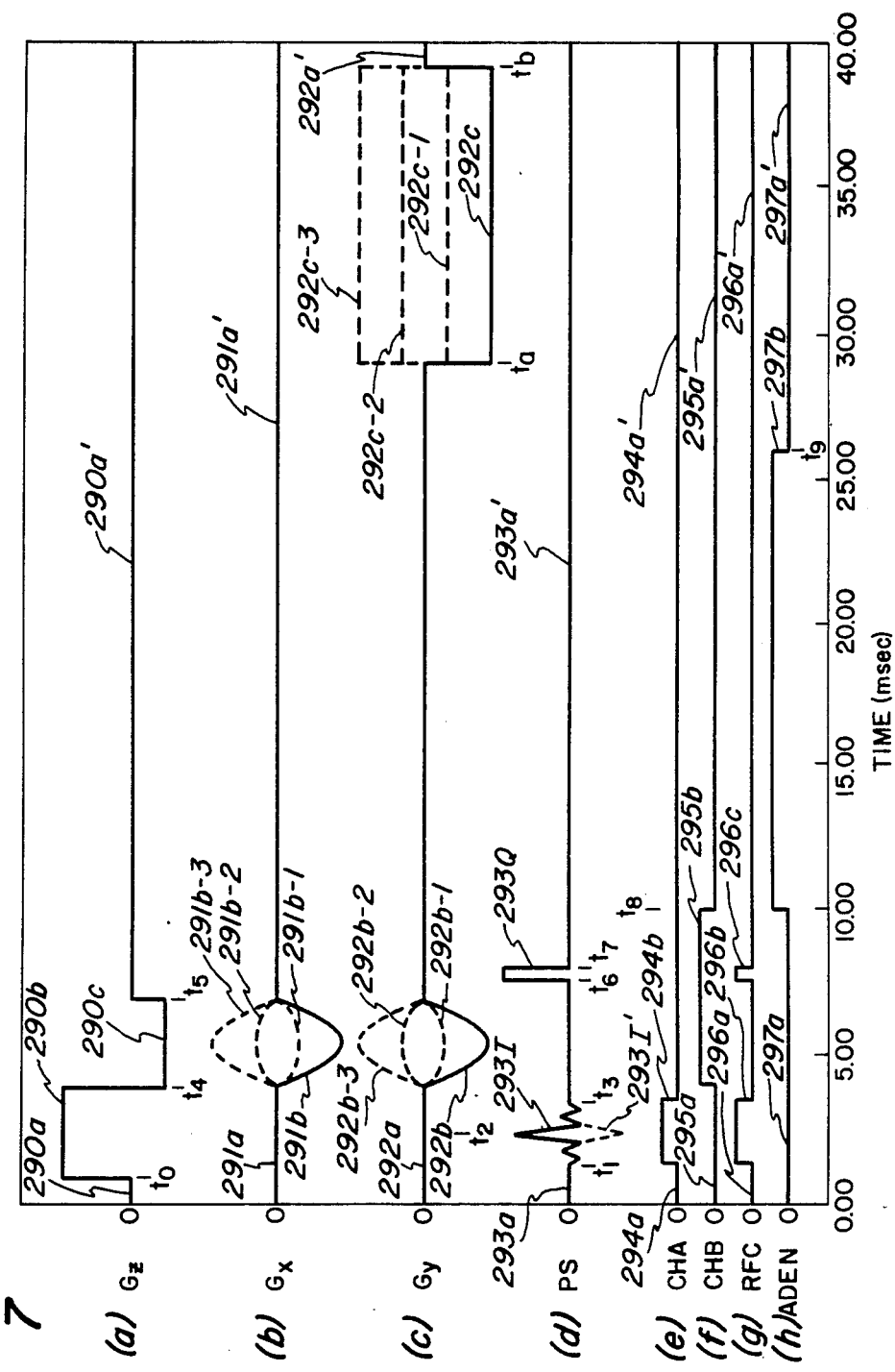

Referring now to FIG. 7, the various system signals for one presently preferred embodiment of a chemical-shift spectroscopic imaging sequence are illustrated. The spectroscopic imaging signal waveforms 290-297 are a modified set of the basic two-dimensional imaging sequence as previously described for FIG. 3. It will be seen, however, that the use of an X-axis gradient field $G_x$ signal is eliminated during the data acquisition time interval, when the ADEN signal portion 297b is at a high logic level (between times $t_8$ and $t_9$), and a phase-encoding $G_x$ gradient field signal lobe 291b (or a sequence-dependent one of a plurality of different magnitude lobes 291b and 291b-1 through 291b-3) is utilized. That one of the $G_x$ gradient signal lobes 291b, 291b-1, 291b-2, 291-3, ..., then in use for the particular sequence, is present during the same time interval, from time $t_4$ to time $t_5$, during which the $G_z$ gradient signal rephasing lobe 290c and the $G_y$ gradient signal phase-encoding lobes 292b are present. It will also be noted that the data acquisition time interval (e.g. between time $t_8$ and time $t_9$) is increased, relative to the basic imaging sequence, to improve frequency resolution of the received image data.

To provide a two-dimensional chemical-shift spectroscopic image, a total of $N_x$ different amplitudes of the $G_x$ gradient signal phase-encoding lobes 291b are utilized, along with $N_y$ different amplitudes of the $G_y$ gradient signal phase-encoding lobes 292b. Thus, the spatial information in the two-dimensional slice is reconstructed by the 2DFT of the $N_x \cdot N_y$ individual response signals, provided by the like number of independent projections using a like number of different permutations of the $G_x$ and $G_y$ gradient field signal lobe amplitudes. A third Fourier transform is performed upon the two-dimensional spatial image information matrix, with respect to data acquisition time, to provide the chemical-shift spectroscopic information at each point in the two-dimensional imaging plane. It should be understood, as with the three-dimensional imaging sequences of FIG. 6, that the chemical-shift spectroscopic imaging sequences of FIG. 7 can be combined with inversion recovery techniques, by adding a 180° non-selective RF signal pulse prior to the 90° selective RF excitation pulse 293I or 293I', at the beginning of each sequence, or can be combined with three-dimensional imaging techniques, by providing a phase-encoding $G_z$ gradient signal lobe in place of the illustrated rectangular rephasing lobe 290c, in addition to the phase-encoding $G_x$ and $G_y$ gradient signal lobes 291b and 292b, respectively. It should also be understood that in the absence of chemical-shifts, i.e. if the imaging volume contains a homogeneous sample, the use of the chemical-shift spectroscopic imaging sequence of FIG. 7 will reveal the magnetic field nonhomogeneity in the imaging plane, allowing the magnetic field nonhomogeneity to be measured as variations in the NMR response signal frequency, with respect to position in that imaging plane; this technique is particularly useful for initial balancing of the magnetic field of the superconducting magnet means.

While one presently preferred embodiment of our novel digital interface subsystem for a high-field magnetic resonance imaging and spectroscopy system, and several presently preferred embodiments of methods for utilizing that subsystem to acquire image data from a sample, have been described in some detail herein, many variations and modifications will now become apparent to those skilled in the art. It is our intent, therefore, to be limited only by the scope of the appending claims and not by way of the specific details and instrumentalities presented by way of description of the presently preferred embodiments herein.

What we claim is:

1. A digital interface subsystem for a nuclear magnetic resonance (NMR) system for the production of images and localized chemical-shifts spectra from a non-ferromagnetic sample, comprising:

control means, receiving externally-provided input data from said NMR system, for separately storing each of a plurality of different sequential sets of operating instructions, and for switching between the operating instructions of the totality of the sets in any selected manner to provide a present operating instruction, with each present instruction controlling the entire present operation of the subsystem in a predetermined manner;

means for generating at least one signal defining a gradient magnetic field and at least one signal defining a radio-frequency (RF) magnetic field excitation waveform and for providing each of the at least one RF signal and at least one magnetic field gradient signal to said system, responsive only to the selected instruction from said control means; and means, receiving a plurality of analog magnetic resonance response signals from said system, for digitizing each different one of the response signals of the plurality in alternating cycle and for providing the digitized response signals in an interleaved manner to said system, for production of a viewable image, only when enabled responsive to said control means instructions.

2. The subsystem of claim 1, wherein said control means includes: means for receiving the externally-provided input data from said NMR system; means for storing said plurality of sequential sets of operating instructions, responsive to at least a portion of the input data provided by said system at said receiving means; and means for retrieving the next sequential instruction from the selected stored set of sequential operating instructions and interacting with all other means of the subsystem to control the operation of all of the subsystem in accordance with each sequential retrieved operating instruction.

3. The subsystem of claim 2, wherein said generating means includes: at least one means for generating an associated gradient magnetic field-defining signal; at least one means for generating an associated RF magnetic field-defining signal; and means for providing each of the associated gradient and RF magnetic field-defining signals to said system only when enabled by the subsystem control means.

4. The subsystem of claim 3, wherein said digitizing means includes: means for receiving said plurality of analog magnetic resonance response signals from said system; means for individually digitizing each of the received response signals and thus providing a corresponding plurality of digitized response data; and means for providing in sequence each one of the plurality of digitized response data as interleaved data to the system, responsive to a continuing enablement of said digitizing means by said control means.

5. The subsystem of claim 2, wherein said digitizing means includes: means for receiving said plurality of analog magnetic resonance response signals from said system; means for individually digitizing each of the received response signals and thus providing a corresponding plurality of digitized response data; and means for providing in sequence each one of the plurality of digitized response data as interleaved data to the system, responsive to a continuing enablement of said digitizing means by said control means.

6. The subsystem of claim 1, wherein said generating means includes: at least one means for generating an associated gradient magnetic field-defining signal; at least one means for generating an associated RF magnetic field-defining signal; and means for providing each of the associated gradient and RF magnetic field-defining signals to said system only when enabled by the subsystem control means.

7. The subsystem of claim 6, wherein said digitizing means includes: means for receiving said plurality of analog magnetic resonance response signals from said system; means for individually digitizing each of the received response signals and the providing a corresponding plurality of digitized response data; and means for providing in sequence each one of the plurality of digitized response data as interleaved data to the system, responsive to a continuing enablement of said digitizing means by said control means.

8. The subsystem of claim 1, wherein said digitizing means includes: means for receiving said plurality of analog magnetic resonance response signals from said system; means for individually digitizing each of the received response signals and thus providing a corresponding plurality of digitized response data; and means for providing in sequence each one of the plurality of digitized response data as interleaved data to the system, responsive to a continuing enablement of said digitizing means by said control means.

9. The subsystem of claim 1, wherein said generating means comprises a plurality of means each for generating one of a plurality of different magnetic field gradients along an associated preselected imaging axis of an imaging coordinate system.

10. The subsystem of claim 9, wherein the coordinate system is the Cartesian coordinate system; and said generating means provides three separate gradient magnetic field signals, each for a different one of three mutually-orthogonal gradient fields.

11. The subsystem of claim 10, further comprising means receiving the three gradient magnetic field signals for switching said gradient field signals responsive to an externally-supplied orientation-control signal to cause the sample to be examined in at least one selected one of a plurality of different image orientations.

12. The subsystem of claim 11, wherein said gradient switching means is configured to allow each sample examination to be provided in a selected one of normal and reverse orientations.

13. The subsystem of claim 9, wherein said generating means comprises a like plurality of means for each providing a different RF excitation waveform signal.

14. The subsystem of claim 13, further comprising means for switching between preselected pairs of signals, each pair having one of the plurality of gradient magnetic field signals and one of the plurality of RF excitation signals, selected in accordance with instructions provided by said control means.

15. The subsystem of claim 14, wherein said generating means controls at least the amplitude and time parameters of all RF excitation and gradient magnetic field signals responsive to the data provided to said subsystem.

16. The subsystem of claim 1, wherein said generating means controls at least the amplitude and time parameters of all RF excitation and gradient magnetic field signals responsive to the data provided to said subsystem.

17. The subsystem of claim 1, wherein at least one of said gradient and RF magnetic field-defining signals is an analog signal.

18. The subsystem of claim 1, further comprising at least one means for providing at least one auxiliary signal to said system, each of said auxiliary signals having characteristics established responsive to that one of said operating instructions then controlling said subsystem.

* * * * *